US012721165B2

(12) United States Patent
Lu

(10) Patent No.: US 12,721,165 B2
(45) **Date of Patent: *Aug. 25, 2026**

(54) SEMICONDUCTOR CIRCUIT STRUCTURE WITH DIRECT DIE HEAT REMOVAL STRUCTURE

(71) Applicant: INVENTION AND COLLABORATION LABORATORY, INC., Taipei City (TW)

(72) Inventor: Chao-Chun Lu, Hsinchu (TW)

(73) Assignee: INVENTION AND COLLABORATION LABORATORY, INC., Taipei City (TW)

( * ) Notice: Subject to any disclaimer, the term of this patent is extended or adjusted under 35 U.S.C. 154(b) by 0 days.

This patent is subject to a terminal disclaimer.

(21) Appl. No.: 19/308,894

(22) Filed: Aug. 25, 2025

(65) Prior Publication Data

US 2025/0379117 A1 Dec. 11, 2025

Related U.S. Application Data

(63) Continuation of application No. 19/210,377, filed on May 16, 2025, now Pat. No. 12,512,387, which is a (Continued)

(51) Int. Cl.
*H10W 40/25* (2026.01)
*H10W 10/00* (2026.01)
(Continued)

(52) U.S. Cl.
CPC ....... *H10W 40/258* (2026.01); *H10W 10/014* (2026.01); *H10W 10/17* (2026.01);
(Continued)

(58) Field of Classification Search
CPC ........... H01L 23/3736; H01L 21/76224; H01L 23/367; H01L 23/49827; H01L 23/481;
(Continued)

(56) References Cited

U.S. PATENT DOCUMENTS 7,012,007 B1 3/2006 Goo et al.
7,052,937 B2 5/2006 Clevenger et al.
(Continued)

FOREIGN PATENT DOCUMENTS

| | | |
|---|---|---|
| JP | 2006-156664 A | 6/2006 |
| JP | 2012-182336 A | 9/2012 |
| TW | 202243011 A | 11/2022 |

OTHER PUBLICATIONS

Extended European Search Report for European Application No. 24206032.5, dated Jun. 4, 2025.

(Continued)

*Primary Examiner* — Patricia D Valenzuela
(74) *Attorney, Agent, or Firm* — Birch, Stewart, Kolasch & Birch, LLP

(57) ABSTRACT

Semiconductor circuit structures with direct die heat removal structure are provided. The semiconductor circuit structure comprises a semiconductor substrate with an original semiconductor surface; a set of active regions within the semiconductor substrate; and a first shallow trench isolation (STI) region neighboring to the set of active regions and extending along a first direction. Wherein the first STI region includes a heat removing layer, and the material of the heat removing layer is different from $SiO_2$.

19 Claims, 27 Drawing Sheets

Related U.S. Application Data continuation of application No. 18/980,888, filed on Dec. 13, 2024, now Pat. No. 12,341,076, which is a continuation of application No. 18/674,649, filed on May 24, 2024, now Pat. No. 12,224,225.

(60) Provisional application No. 63/572,960, filed on Apr. 2, 2024, provisional application No. 63/555,918, filed on Feb. 21, 2024, provisional application No. 63/543,724, filed on Oct. 11, 2023, provisional application No. 63/523,645, filed on Jun. 28, 2023.

(51) Int. Cl.

| | |
|---|---|
| ***H10W 10/17*** | (2026.01) |
| ***H10W 40/22*** | (2026.01) |
| ***H10W 70/63*** | (2026.01) |
| *H10D 84/01* | (2025.01) |
| *H10D 84/03* | (2025.01) |
| *H10D 84/83* | (2025.01) |
| *H10W 20/20* | (2026.01) |
| *H10W 90/00* | (2026.01) |
| *H10W 90/20* | (2026.01) |
| *H10W 90/26* | (2026.01) |

(52) U.S. Cl.

CPC ......... *H10W 40/22* (2026.01); *H10W 70/635* (2026.01); *H10D 84/0149* (2025.01); *H10D 84/038* (2025.01); *H10D 84/834* (2025.01); *H10W 20/20* (2026.01); *H10W 90/00* (2026.01); *H10W 90/26* (2026.01); *H10W 90/288* (2026.01)

(58) Field of Classification Search

CPC ....... H01L 25/0657; H01L 2225/06565; H01L 2225/06589; H01L 23/3677; H10D 84/0149; H10D 84/038; H10D 84/834; H10D 30/62; H10D 84/0151; H10W 40/258; H10W 10/014; H10W 10/17; H10W 40/22; H10W 70/635; H10W 20/20; H10W 90/00; H10W 90/26; H10W 90/288; H10W 40/228

See application file for complete search history.

(56) References Cited

U.S. PATENT DOCUMENTS

| | | | | |
|---|---|---|---|---|
| 7,286,359 | B2 | 10/2007 | Khbeis et al. | |
| 7,345,364 | B2 | 3/2008 | Kerr et al. | |
| 7,572,680 | B2 | 8/2009 | Hess et al. | |
| 7,722,692 | B2 | 5/2010 | Hiraiwa et al. | |
| 8,022,532 | B2 | 9/2011 | Kasuya et al. | |
| 8,106,497 | B2 | 1/2012 | Brunnbauer et al. | |
| 8,130,500 | B2 | 3/2012 | Oda | |
| 8,466,054 | B2 | 6/2013 | Stuber et al. | |
| 8,912,574 | B2 | 12/2014 | Dahlstrom et al. | |
| 9,018,754 | B2 | 4/2015 | Gambino et al. | |
| 9,059,269 | B2 | 6/2015 | Botula et al. | |
| 9,337,078 | B2 | 5/2016 | Gambino et al. | |
| 9,530,711 | B2 | 12/2016 | Botula et al. | |
| 10,256,188 | B2 | 4/2019 | Venugopal et al. | |
| 10,529,641 | B2 | 1/2020 | Venugopal et al. | |
| 10,811,334 | B2 | 10/2020 | Cook et al. | |
| 11,004,680 | B2 | 5/2021 | Venugopal et al. | |
| 11,380,645 | B2 | 7/2022 | Yu et al. | |
| 11,676,880 | B2 | 6/2023 | Cook et al. | |
| 12,224,225 | B2 * | 2/2025 | Lu | H01L 23/3736 |
| 12,272,616 | B2 | 4/2025 | Yu et al. | |
| 2004/0022102 | A1 | 2/2004 | Liang et al. | |
| 2004/0061229 | A1 | 4/2004 | Moslehi | |
| 2004/0222528 | A1 | 11/2004 | Kunikiyo | |
| 2004/0223606 | A1 | 11/2004 | Enete et al. | |
| 2008/0224257 | A1 | 9/2008 | Mori | |
| 2008/0266787 | A1 | 10/2008 | Gosset et al. | |
| 2012/0146098 | A1 | 6/2012 | Dahlstrom et al. | |
| 2014/0367784 | A1 | 12/2014 | Rivero et al. | |
| 2015/0069571 | A1 | 3/2015 | Gambino et al. | |
| 2015/0084128 | A1 | 3/2015 | Gambino et al. | |
| 2015/0091129 | A1 | 4/2015 | Gambino et al. | |
| 2015/0156913 | A1 | 6/2015 | Wilkerson | |
| 2015/0255363 | A1 | 9/2015 | Botula et al. | |
| 2016/0013184 | A1 | 1/2016 | Alptekin et al. | |
| 2018/0151464 | A1 | 5/2018 | Cook et al. | |
| 2018/0151471 | A1 | 5/2018 | Cook et al. | |
| 2019/0326324 | A1 | 10/2019 | Lee et al. | |
| 2020/0027973 | A1 | 1/2020 | Botula et al. | |
| 2020/0185388 | A1 | 6/2020 | Lu | |
| 2022/0077315 | A1 | 3/2022 | Lu | |
| 2022/0108951 | A1 | 4/2022 | Adusumilli et al. | |
| 2022/0285495 | A1 * | 9/2022 | Hung | H01L 23/36 |
| 2024/0047298 | A1 | 2/2024 | Tong et al. | |
| 2025/0006584 | A1 | 1/2025 | Lu | |
| 2025/0006586 | A1 | 1/2025 | Lu | |
| 2025/0112116 | A1 | 4/2025 | Lu | |
| 2025/0279333 | A1 | 9/2025 | Lu | |
| 2025/0379117 | A1 | 12/2025 | Lu | |
| 2026/0075939 | A1 | 3/2026 | Hammond | |

OTHER PUBLICATIONS

Partial European Search Report for European Application No. 24205247.0, dated May 30, 2025.

US Office Action for U.S. Appl. No. 19/004,132, dated Apr. 9, 2025.

Japanese Office Action for Japanese Application No. 2024-177749, dated Aug. 26, 2025, with English translation.

U.S. Office Action for U.S. Appl. No. 19/308,943, dated Oct. 29, 2025.

Japanese Office Action for Japanese Application No. 2024-178689, dated Mar. 3, 2026, with English translation.

U.S. Office Action for U.S. Appl. No. 18/533,720, dated Feb. 6, 2026.

U.S. Office Action for U.S. Appl. No. 18/534,960, dated Jun. 17, 2026.

* cited by examiner

Cross section

Top view

SEMICONDUCTOR CIRCUIT STRUCTURE WITH DIRECT DIE HEAT REMOVAL STRUCTURE

This application is a continuation of U.S. patent application Ser. No. 19/210,377 filed on May 16, 2025, which is a continuation of U.S. patent application Ser. No. 18/980,888 filed on Dec. 13, 2024, which is a continuation of patent application Ser. No. 18/674,649 filed on May 24, 2024, which claims the benefits of U.S. Provisional Application No. 63/523,645, filed on Jun. 28, 2023, U.S. Provisional Application No. 63/543,724, filed on Oct. 11, 2023, U.S. Provisional Application No. 63/555,918, filed on Feb. 21, 2024, and U.S. Provisional Application No. 63/572,960, filed on Apr. 2, 2024, the subject matters of which are incorporated herein by reference.

BACKGROUND

Technical Field

The present disclosure relates to semiconductor structures, and more particularly to semiconductor circuit structures with direct die cooling technology.

Description of the Related Art

The monolithic integration capability of a Silicon chip has developed from GSI (Giga Scale Integration: Over billions of transistors on a die) to TSI (Tera Scale Integration: Trillions of transistors on a die), and running such a large number of transistors cause a sharp increase in power consumption. The increased power consumption elevates adversely the junction temperature of transistors and thus the entire chip temperature due to current limited heat-dissipation capability. Thermal conductivity index of Silicon-dioxide is very low and that of Silicon itself is not very high. This material and device structural problem cause a negative cyclic effect, that is, the elevated higher die temperature slows down the speed of transistors, and then inevitably enforcing the design to increase higher power to circuitry in order to accelerate the transistor performance but this mechanism causes badly raising the die temperature, and consequently the heat-dissipation problem is getting worse. This insufficient heat dissipation problem causing higher temperature to chip operation is regarded as the worst problem for the entire chip industry to solve to avoid a major roadblock to a larger number of device integration on a die. The progress of reducing the temperature of a GSI chip is not improved well as it should be, however.

Actually, as the transistor dimensions must be made smaller as the technology node is being scaled further (e.g., the minimum feature size is being scaled from 7 nm to 5 nm, then to 3 nm and so forth), the percentage of oxide coverage to the total transistor size is getting higher and the thermal dissipation capability across the device junctions is further being aggregated. Though a lot of heat dissipation methods are created, for example, covering the entire chip with higher heat-removal pad outside the chip or using a liquid cooling circulation outside the packaged chip, etc., all of which are very expensive but returned with low efficiency for effectively reducing the junction temperatures of transistors.

SUMMARY

The present invention focuses on creating particularly heat remover (HR) structures in the semiconductor die during the monolithic processes of making the transistor itself. Such HR structure is kind of being connected over the entire die as a single piece designed for enlarging the thermal dissipation area as much as possible. In addition, this HR construction can be connected to the entire edge of the die so that it can be easier to be connected to some heat sink outside the semiconductor die in order to create much larger thermal dissipation paths from the die to be facilitated to be connected to the outside environment of the die and thus the packaged chip. This new HR structure is considered as the most close-by path for achieving very effective heat dissipation function directly associated with individual transistor, and moreover all these HR could be connected together and across the entire die as a piece of optimized heat dissipation network built within the die.

An embodiment of the present disclosure provides a semiconductor circuit structure. The semiconductor circuit a structure includes semiconductor substrate with an original semiconductor surface; a set of active regions within the semiconductor substrate; and a first shallow trench isolation (STI) region neighboring to the set of active regions and extending along a first direction. Wherein the first STI region includes a heat removing layer, and the material of the heat removing layer is different from $SiO_2$.

According to an aspect of the present disclosure, the thermal conductivity of the heat removing layer is higher than that of $SiO_2$.

According to an aspect of the present disclosure, the heat removing layer is an electrical insulator during the operation of the semiconductor circuit structure.

According to an aspect of the present disclosure, the heat removing layer extends into one of the set of the active regions.

According to an aspect of the present disclosure, the heat removing layer includes a metal layer and a thin insulating layer, and the thin insulating layer is between the metal layer and the set of active regions.

According to an aspect of the present disclosure, the heat removing layer includes a composite material.

According to an aspect of the present disclosure, the first STI region further includes a $SiO_2$ layer under the heat removing layer.

According to an aspect of the present disclosure, the heat removing layer is within a front end of line (FEOL) region of the semiconductor circuit structure.

According to an aspect of the present disclosure, the first STI region surrounds the set of active regions.

According to an aspect of the present disclosure, the heat removing layer is within the first STI region and positioned under the original semiconductor surface, and the heat removing layer surrounds the set of active regions.

According to an aspect of the present disclosure, wherein a spare STI region is connected to the first STI region, and the heat removing layer extends along the first direction to the spare STI region.

According to an aspect of the present disclosure, the spare STI region is close to a center of the semiconductor substrate, or close to an edge portion of the semiconductor substrate.

According to an aspect of the present disclosure, a heat removing pad is within the spare STI region, and the heat removing layer is connected to the heat removing pad.

According to an aspect of the present disclosure, a thermal via is above the spare STI region and connected to the heat removing pad within the spare STI region.

According to an aspect of the present disclosure, a heat dissipation plate is above and connected to the thermal via.

According to an aspect of the present disclosure, a plurality of insulators are above the set of active regions, wherein the thermal via penetrates through the plurality of insulators and connects to the heat removing pad within the spare STI region.

According to an aspect of the present disclosure, the plurality of insulators and the thermal via are within a back end of line (BEOL) region of the semiconductor circuit structure.

According to an aspect of the present disclosure, a through semiconductor via (TSV) extends from a backside surface of the semiconductor substrate to a bottom surface of the heat removing pad within the spare STI region, wherein the backside surface is opposite to the original semiconductor surface.

According to an aspect of the present disclosure, a heat dissipation plate is under the backside surface of the semiconductor substrate and connected to the through semiconductor via.

According to an aspect of the present disclosure, the first STI region surrounds four sidewalls of one of the set of the active regions.

Another embodiment of the present disclosure provides a semiconductor circuit structure including a semiconductor substrate with an original semiconductor surface; a set of transistors formed within the semiconductor substrate; and a composite-material STI region neighboring to the set of transistors and extending along a first direction to an edge portion of the semiconductor substrate; wherein the composite-material STI region is within a front end of line (FEOL) region of the semiconductor circuit structure.

According to an aspect of the present disclosure, the composite-material STI region comprises a heat removal layer neighboring to the set of transistors and extending along the first direction to the edge portion of the semiconductor substrate.

According to an aspect of the present disclosure, a thermal via is above or under the heat removal layer, wherein the thermal via is connected to the heat removal layer.

According to an aspect of the present disclosure, a heat dissipation plate is above or under the semiconductor substrate, wherein the semiconductor substrate is connected to the thermal via.

According to an aspect of the present disclosure, the thermal via is within a back end of line (BEOL) region of the semiconductor circuit structure.

Another embodiment of the present disclosure provides a semiconductor circuit structure including a semiconductor substrate with an original semiconductor surface; a first set of active regions within the semiconductor substrate and extending along a first direction; a second set of active regions within the semiconductor substrate and extending along the first direction; and a first shallow trench isolation (STI) region between the first set of active regions and the second set of active regions, the first shallow trench isolation (STI) region extending along the first direction; wherein the first STI region includes a heat removing layer extending along the first direction, and the thermal conductivity of the heat removing layer is higher than that of $SiO_2$.

According to an aspect of the present disclosure, the semiconductor circuit structure further comprises a spare STI region remote from the first set of active regions and the second set of active regions, the spare STI region is connected to the first STI region and includes a heat removing pad within the spare STI region, wherein the heat removing layer is connected to the heat removing pad.

According to an aspect of the present disclosure, wherein a width of the heat removing pad is greater than a width of the heat removing layer.

The above and other embodiments of the disclosure will become better understood with regard to the following detailed description of the non-limiting embodiment(s). The following description is made with reference to the accompanying drawings.

DETAILED DESCRIPTION

Figure 1A:
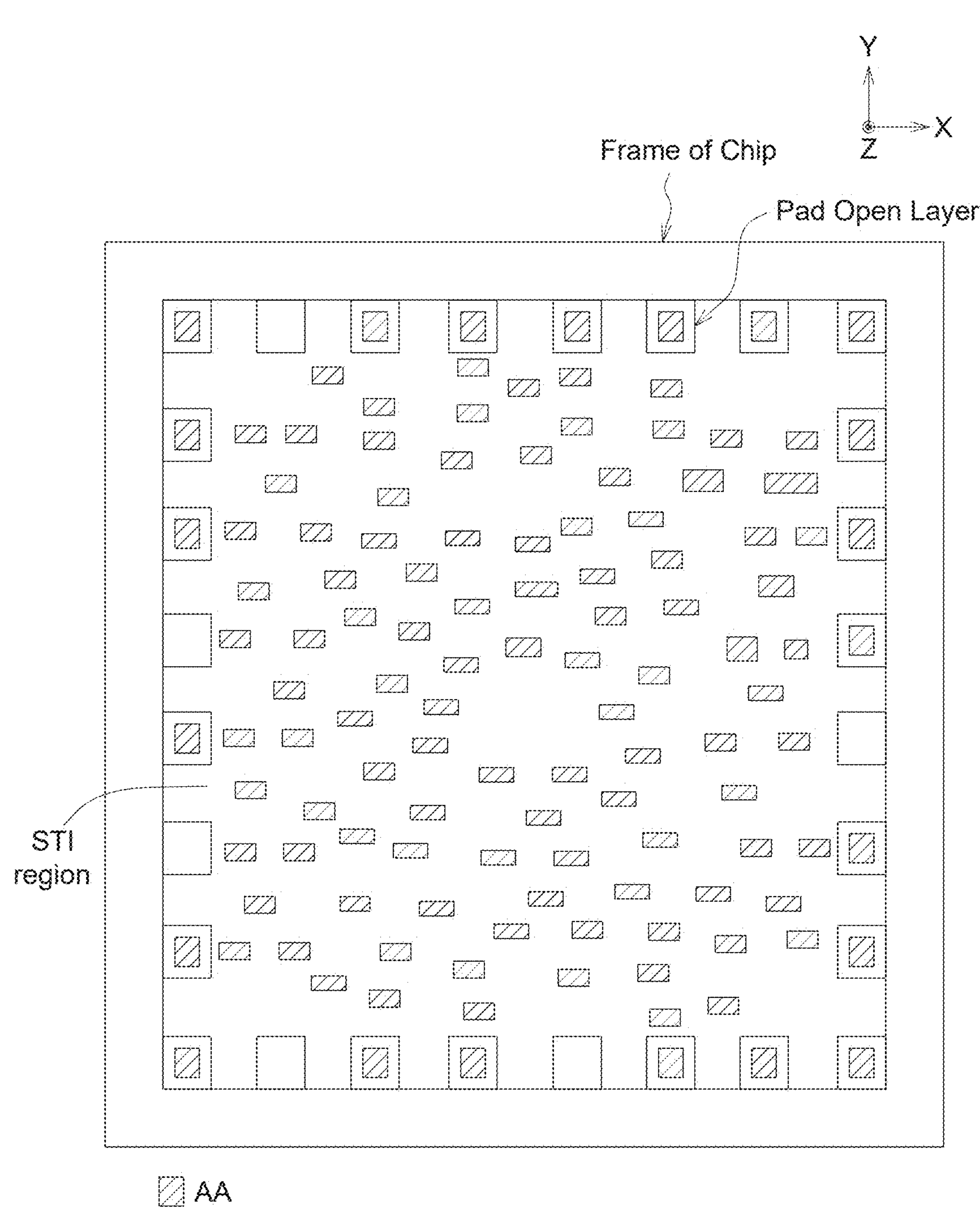
FIG. 1*a* illustrates a schematic top view of a conventional semiconductor circuit structure with STI regions and active areas, FIG. 1*b* and FIG. 1*c* describe top view of portion area in FIG. 1*a* and cross section thereof, respectively

Various embodiments will be described more fully hereinafter with reference to accompanying drawings, which are provided for illustrative and explaining purposes rather than a limiting purpose. For clarity, the components may not be drawn to scale. In addition, some components and/or reference numerals may be omitted from some drawings. It is contemplated that the elements and features of one embodiment can be beneficially incorporated in another embodiment without further recitation. In the following methods for manufacturing semiconductor devices, there may be one or more additional operations between the operations described, and the order of the operations may vary. The illustration uses the same/similar reference numerals to indicate the same/similar elements.

As used in the specification and the appended claims, the ordinals such as "first", "second" and the like to describe elements do not imply or represent a specific position in the structure, or the order of arrangement, or the order of manufacturing. The ordinals are only used to clearly distinguish multiple elements with the same name. As used in the specification and the appended claims, spatial relation terms such as "on", "above", "over", "upper," "top", "below", "beneath", "under", "lower", "bottom" and the like may be used to describe the relative spatial relations or positional relations between one element(s) and another element(s) as illustrated in the drawings, and these spatial relations or positional relations, unless specified otherwise, can be direct or indirect. The spatial relation terms are intended to encompass different orientations of structures in addition to the orientation depicted in the drawings. The structure can be inverted or rotated by various angles, and the spatial relation descriptions used herein can be interpreted accordingly.

Additionally, the terms "electrically connected" and "electrically coupled" used in the specification and claims can refer to an ohmic contact between elements, or current passing through elements, or an operational relation between elements. The operational relation may mean, for example, that one element is used to drive another element, but current may not flow directly between these two elements.

Figure 1B:
Figure 1B:
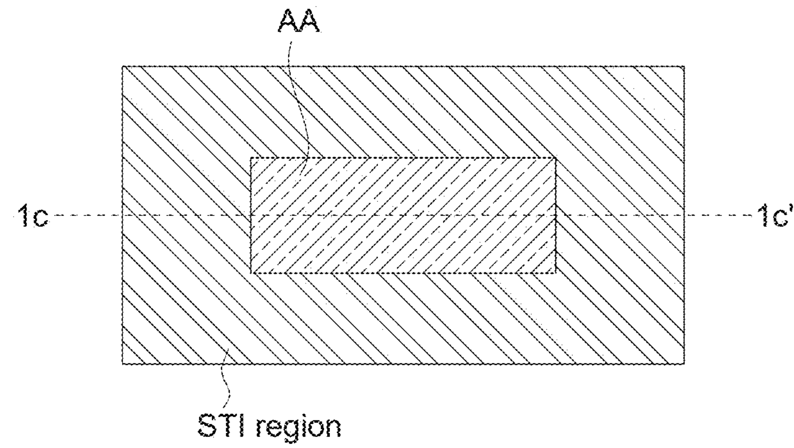
Figure 1C:
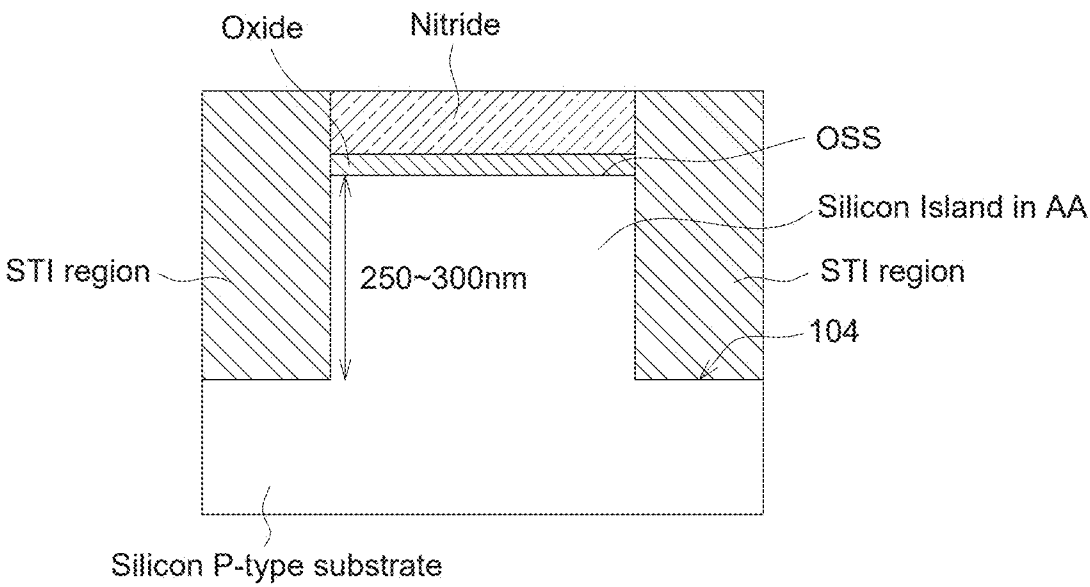

In conventional semiconductor circuit structure of a semiconductor substrate, there are many active regions or active areas (AA) in which the transistors or circuit elements are located, and there are many shallow trench isolation (STI) regions surrounding those active regions, as shown in FIG. 1*a*. Moreover, FIG. 1*b* and FIG. 1*c* describe top view of some portion area in FIG. 1*a* and cross section thereof. Wherein, before manufacturing the transistors, the silicon islands in the active regions are covered by the oxide layer and the nitride layer, all of which are deposited above the original semiconductor surface (OSS) of the semiconductor substrate. Nevertheless, the depth of the STI region extending down from the OSS is usually 250~300 nm, and the material of the STI region is commonly $SiO_2$ with quite low thermal conductivity of 1.3~1.5 W/m×K. Thus, STI regions could elevate higher die temperature and slow down the speed of transistors. To be worse, the STI regions in the semiconductor substrate may occupy 40% or more of total area of the semiconductor substrate, and those STI regions provide no special function except the isolation purpose.

Figure 2A:
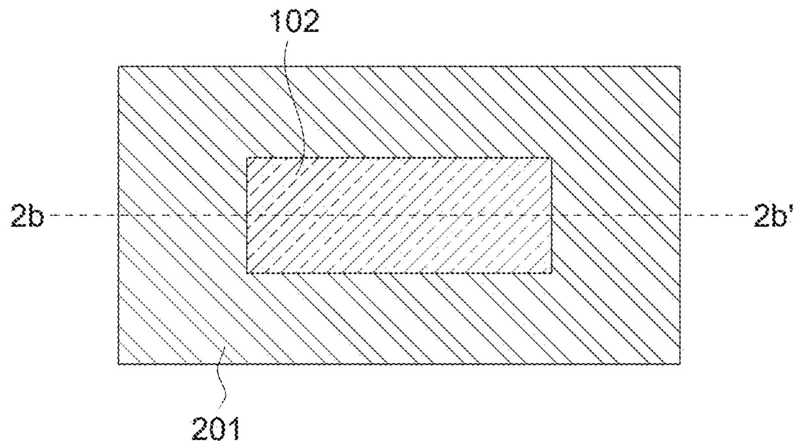
FIG. 2*a* and FIG. 2*b* illustrate a top view and a cross-section view after the active region and form shallow trench isolation (STI) region are formed.
Figure 2B:
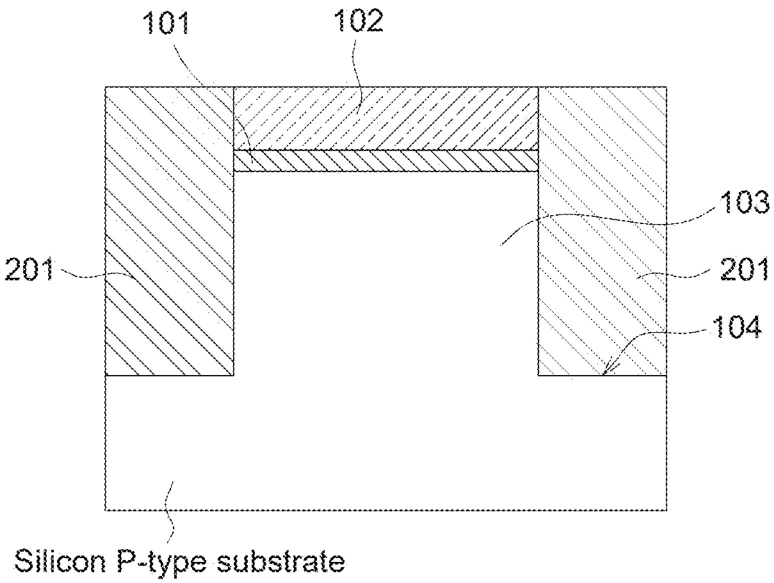

The following describes how to manufacturing heat removal structures in the substrate or the die according to an embodiment of the present invention. Please refer to FIG. 2*a* and FIG. 2*b*. To begin with, on top of the original semiconductor surface, a thin pad-oxide layer 101 is thermally grown and then a layer of pad-nitride-1 102 is deposited over the thin pad-oxide layer 101. Use the photolithographic etching technique to define the active region 103 in which the transistor body 1031 or fin structure will be located under the composite layer of pad-nitride-1 102 and the pad-oxide 101. Outside of this active region 103 a concave trench region 104 (its depth t1 calculated from OSS is 250~300 nm) connected in the wafer has been formed. Then deposit a thick oxide and use the CMP (Chemical-Mechanical-Polishing) technique to make the STI (Shallow Trench Isolation) 201 with its top surface leveled up with the top surface of the Pad-Nitride-1 layer 102 (wherein the top view and the cross section are shown in FIG. 2*a* and FIG. 2*b*, respectively).

Figure 3A:
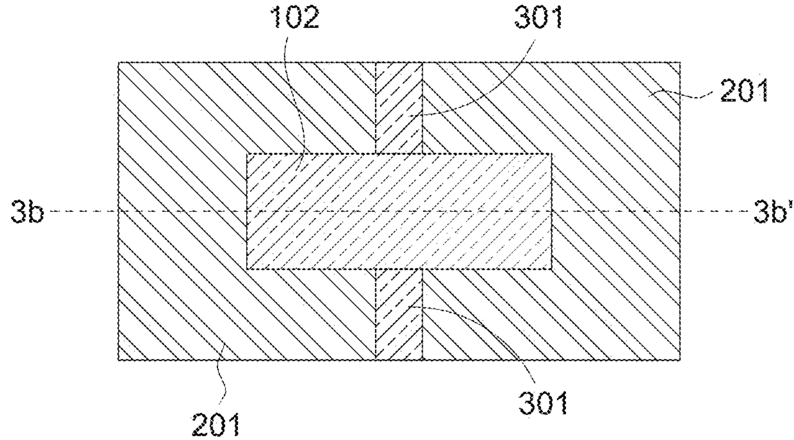
FIG. 3*a* and FIG. 3*b* illustrate a top view and a cross-section view after a protection zone made of nitride is formed above the center of the active region.
Figure 3B:
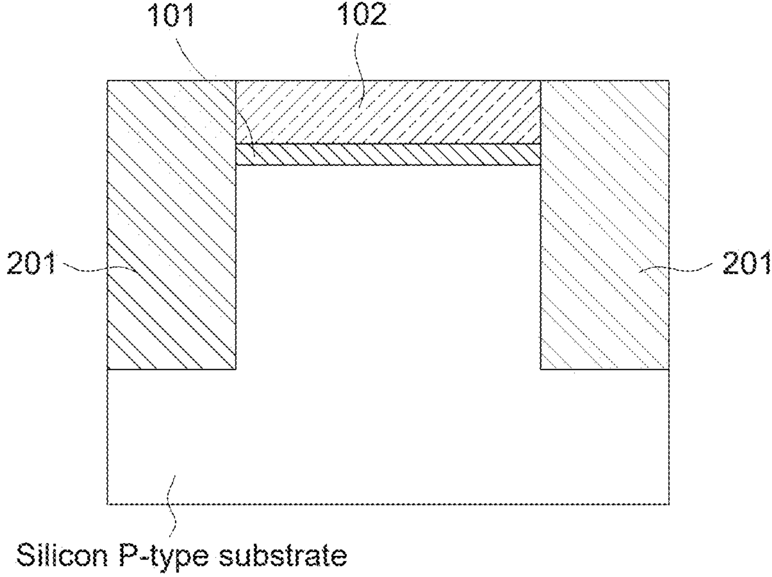
Figure 4A:
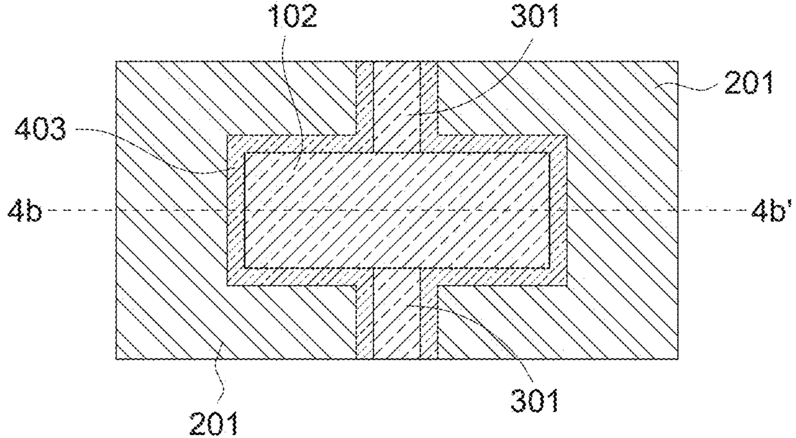
FIG. 4*a* and FIG. 4*b* illustrate a top view and a cross-section view after a vertical spacer is formed to cover the revealed silicon sidewalls.
Figure 4B:
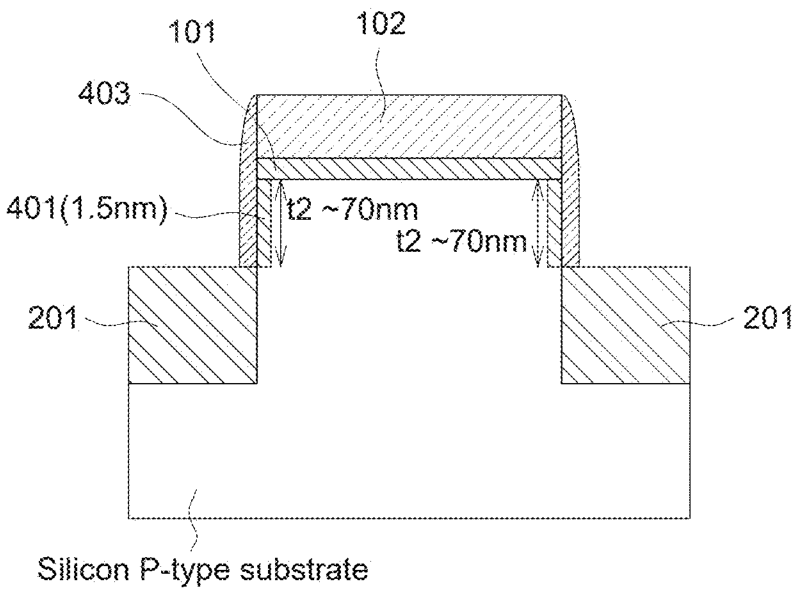

Then refer to FIG. 3*a* and FIG. 3*b*. Deposit a pad-nitride-2 layer 301 and use the photolithographic mask technique to leave a portion of this pad-Nitride-2 layer 301 at the center of the active region 103. Wherein, the top view and the cross section are shown in FIG. 3*a* and FIG. 3*b*, respectively. Afterward, please refer to FIG. 4*a* and FIG. 4*b* (the top view and the cross section are shown in FIG. 4*a* and FIG. 4*b*, respectively), etch away the oxide inside the exposed STI region 201 to a depth of t2 (e.g., 70 nm, or 100~170 nm deep). Keep the pad-nitride-2 layer 301 and the oxide of the STI region 201 under the pad-nitride-2 layer 301 untouched. So, there are silicon sidewalls under the OSS are exposed. Then use a thermal oxidation proceed to grow a thin layer of oxide 401 on these sidewalls (e.g., the thickness is about 1.5~3 nm). Afterward, deposit another pad-nitride-3 layer 403. Use an anisotropic etching technique to make the pad-nitride-3 layer 403 as spacers on the vertical sidewalls. Under an appropriate design on purpose, the pad-nitride-2 layer 301 is remained on its planar surface but is getting thinner due to the anisotropic etching of making the pad-nitride-3 spacer 403.

Figure 5A:
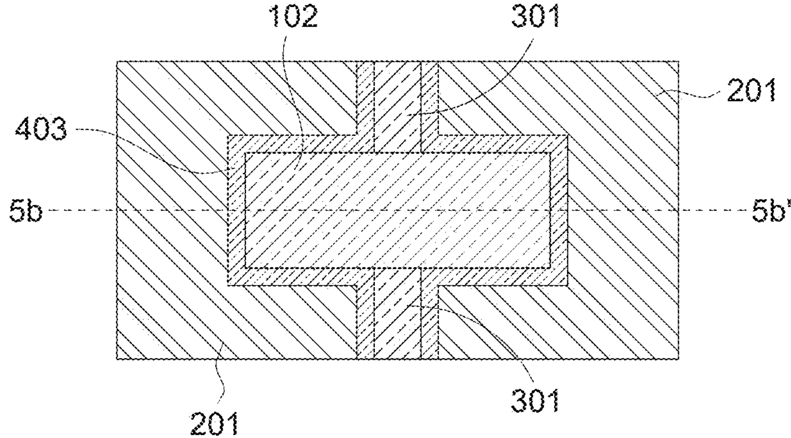
FIG. 5*a* and FIG. 5*b* illustrate a top view and a cross-section view after deeper silicon sidewalls are revealed.
Figure 5B:
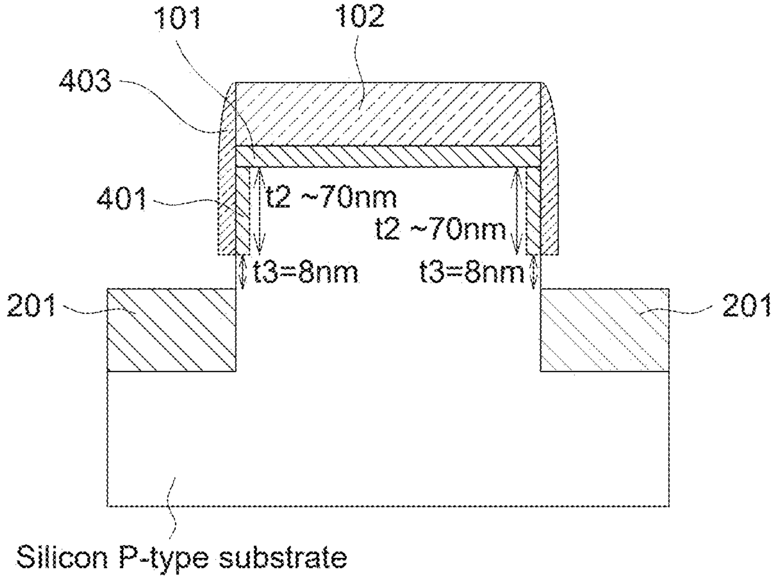

Please refer to FIG. 5*a* and FIG. 5*b* which show the top view and the cross section, respectively. Use an anisotropic etching technique to remove the exposed oxide layer inside most of the STI region 201 by a thickness of t3 around 8 nm, which results in a planar oxide surface with its distance from the top of the exposed oxide surface to the OSS by a distance around 78 nm (t2+t3). Use an isotropic etching technique to remove the exposed thin oxide layers 401 so that the silicon on sidewalls is revealed.

Figure 6A:
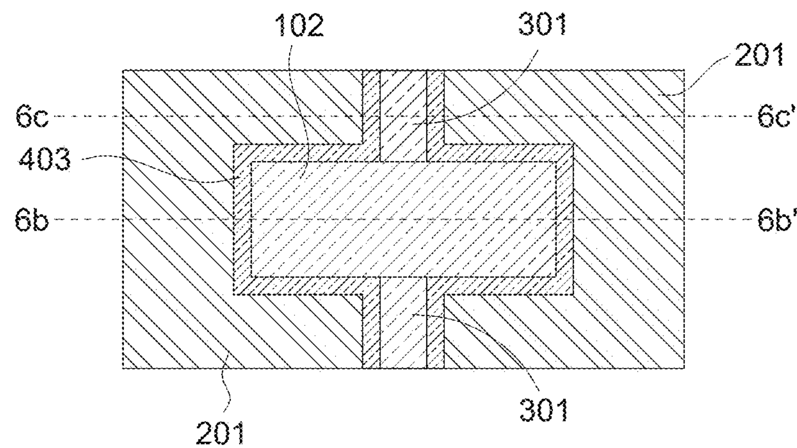
FIG. 6*a*, FIG. 6*b* and FIG. 6*c* illustrate a top view and two different cross-section views after vacant tunnel regions are formed.
Figure 6B:
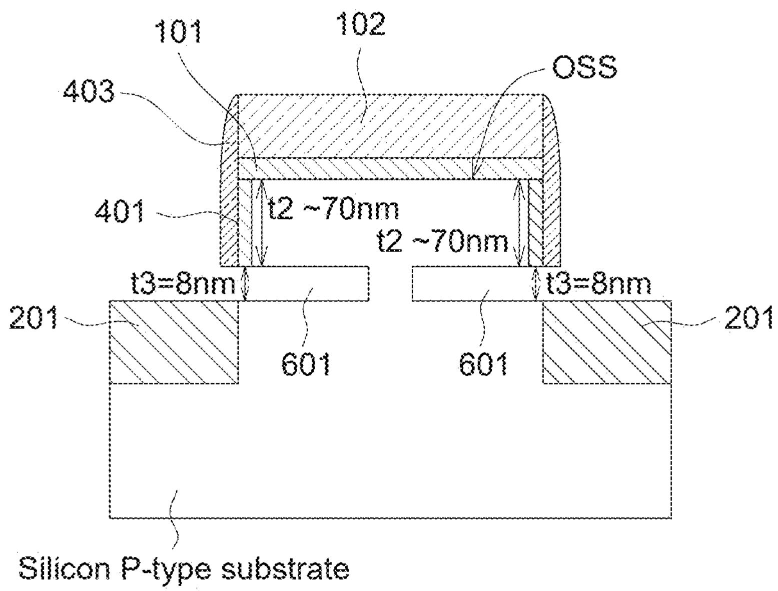
Figure 6C:
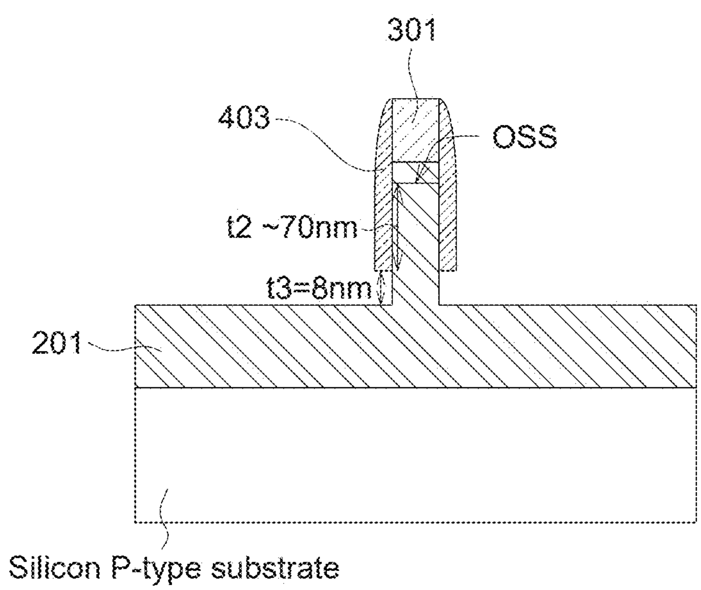

Please refer to FIG. 6*a*, FIG. 6*b* and FIG. 6*c*, wherein FIG. 6*a* is the top view, FIG. 6*b* is the cross section along cut line 6*b*-6*b*' shown in FIG. 6*a*, and FIG. 6*c* is the cross section along cut line 6*c*-6*c*' shown in FIG. 6*a*, respectively. Use an isotopic etching technique to remove part of the exposed silicon surface, especially that etching rate over the crystalline orientation of (110) can be optimally adjusted in much faster than that of (100). Therefore, the silicon layer along the created exposed region can be removed to form vacant tunnel regions 601, but the removal process can be well controlled to be terminated at an appropriate adjustment time to leave the silicon protected by the vertical distance underneath the pad-nitride-3 spacer 403.

It should be noticed that a different process could be used to accomplish the similar structure as show in FIG. 6*a*, FIG. 6*b* and FIG. 6*c*. For example, after the structure was created as shown in FIG. 5*a* and FIG. 5*b*, then instead of using the aforementioned isotropic etching technique to remove part of the exposed silicon surface, a thermal oxidation process can be used to grown away the exposed silicon areas. Since the exposed silicon area can have somewhat narrow horizontal distance, the grown oxide layer (such as thermal oxide) underneath the top surface of the silicon island can fill the horizontal void quickly with nice smooth close-up shape but the bulk silicon material under the coverage of the pad-Nitride-3 spacer 403 is well protected to connect the semiconductor body region of the transistor to the wafer substrate as a strong pillar area without being oxidized too much. Then use an isotropic etching technique to remove this thermal oxide to result in similar structures shown in FIG. 6*a*, FIG. 6*b* and FIG. 6*c*.

Figure 7A:
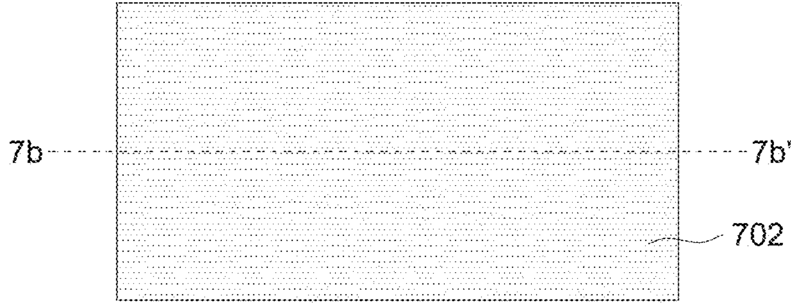
FIG. 7*a* and FIG. 7*b* illustrate a top view and a cross-section view after the high thermal dissipation material is deposited.
Figure 7B:
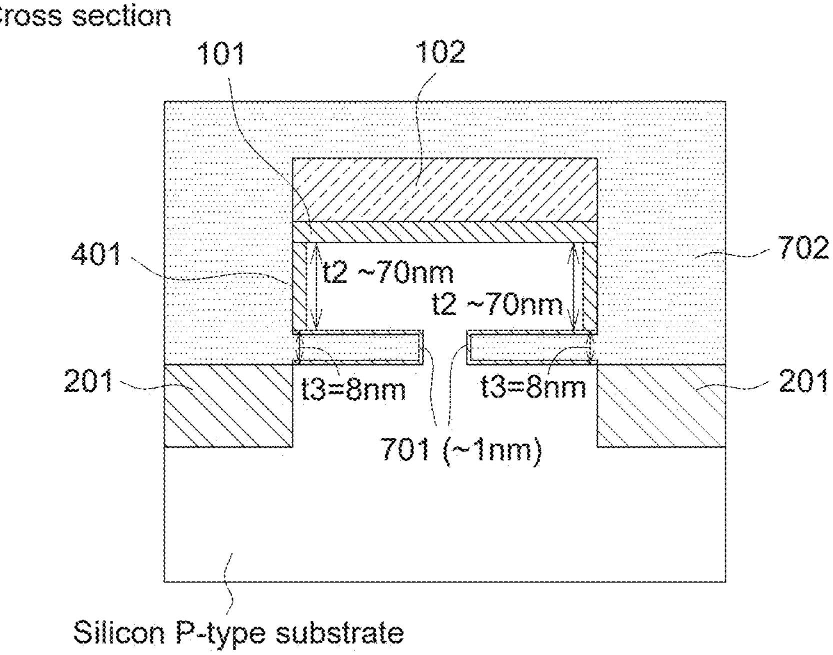

Please refer to FIGS. 7*a* and 7*b*. Adopt an isotropic etching technique to take away the pad-nitride-3 spacer 403. Use a thermal oxidation process to grow a very thin oxide layer 701 (e.g., 1~3 nm) to well protect the just created and exposed silicon surface. Then select a suitable material which has very high thermal conductivity (such as Boron-Nitride, BN, which is an electrical insulator but has very high thermal conductivity, such as 600 W/m×K versus 149 W/m×K of silicon material; Aluminum-Nitride, AlN, material which has its thermal conductivity as high as 321 W/m×K; or any other material with suitable thermal conductivity, any of which could be called as Z material 702). Then use a CVD process to fill in the vacant tunnel regions 601 as created by the aforementioned processing results, for example, BN is selected. Of course, the vacancy inside the STI area is filled by BN material (wherein the top view and the cross section are shown in FIG. 7*a* and FIG. 7*b*, respectively).

In another embodiment, the thermal conductivity of the Z material 702 is higher than silicon, or higher than silicon nitride, or higher than 10 W/m·K or 30 W/m·K. Of course, other possible material of Z material 702 could be graphene or metal, (such as Copper, Tungsten, or composite metal, etc.), and it is better that the tungsten layer could be covered by another barrier TiN layer or suitable layer. When the material of Z material 702 is metal, there could be a thin insulator, such as thermal oxide, between the active region and the Z material 702. Moreover, the material of Z material 702 could be a composite material comprising two or more above-mentioned materials. It is clear that the Z material 702 is different from the original material ($SiO_2$) of the STI region. In another embodiment, the Z material is also different from silicon nitride. The Z material 702 may include material with thermal conductivity higher than the original isolation material (such as oxide) in the STI region, such as AlN, BN, SiC, Si, deposited diamond, or SiGe, etc.

Thereafter, a CMP technique can be used to take away the BN material or Z material 702 over the pad-nitride-1 layer 102 to a planar surface topography, and an anisotropic etching technique is further used to remove some BN material or Z material 702 over the STI region 201. The top of the remained Z material 702 could be aligned with the OSS, or lower than the OSS. Then deposit a layer of oxide 801 over the top of the remained Z material 702 and level up to the pad-nitride-1 layer 102. After removal of the pad-nitride-2 layer 301, the silicon surface is covered by the pad-nitride-1 layer 102 and oxide-covered STI region 201, and the familiar processes can be carried on to complete the transistors (such as planar transistor, FinFET transistor, or GAA transistor, etc.) in the remaining semiconductor active region (see FIG. 8, wherein the top view and the cross section are shown in 8*a* and 8*b*, respectively).

Figure 8A:
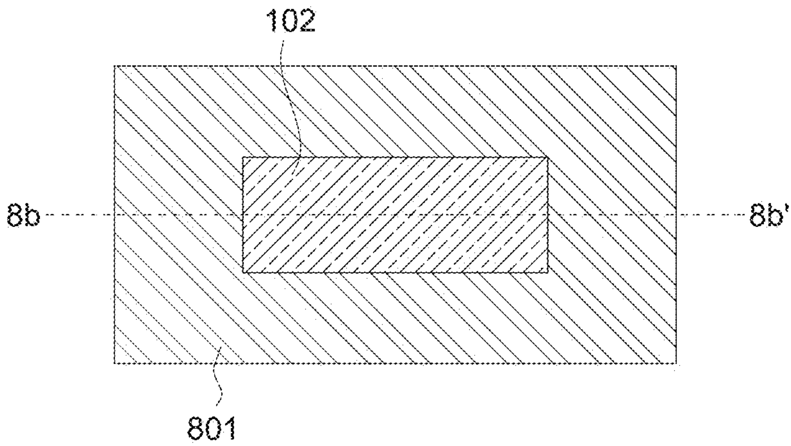
FIG. 8*a* and FIG. 8*b* illustrate a top view and a cross-section view after the Horizontal Heat-Dissipation Plate (HHDP) and the Vertical Heat-Dissipation Column (VHDC) are formed.
Figure 8B:
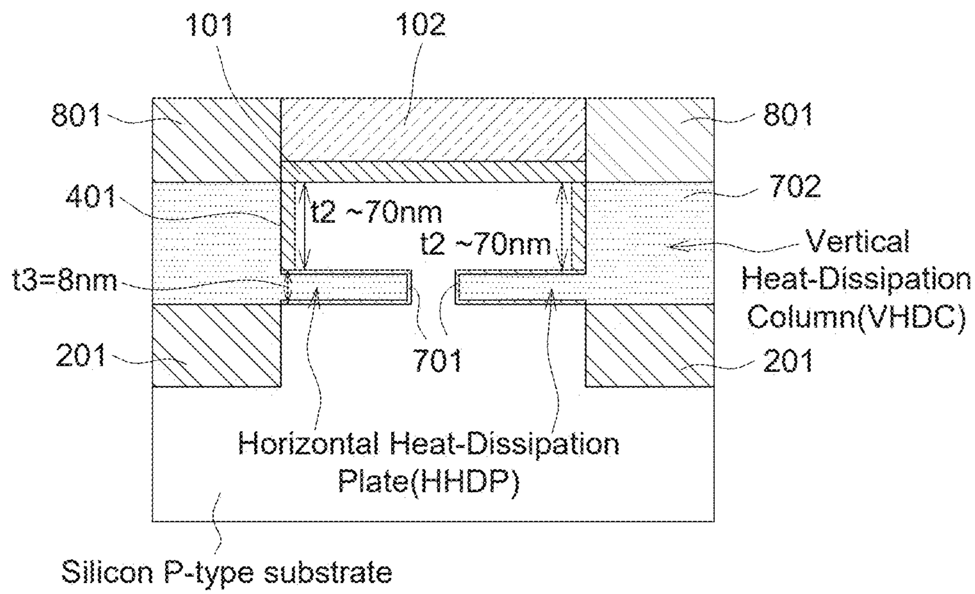

Some BN material or Z material 702 is filled into the vacant tunnel regions under the active region (or the silicon body region of the FinFET/Tri-gate device), it is thus given a name as Horizontal Heat-Dissipation Plate (HHDP), as shown in FIG. 8. Some Z material 702 is filled into the STI's vertical vacant area, which is then named as Vertical Heat-Dissipation Column (VHDC). After the transistor is formed in the active region, the source/drain regions of the transistor are positioned close to HDDP and VHDC which have higher thermal conductivity than that of either silicon dioxide (or silicon) materials surrounding the conventionally designed transistor. Actually, the hottest areas of transistor in full operation are centered at the p/n junction areas between the drain region and the source region both connected with the channel region of the transistor, respectively, these HDDP and VHDC structures are very effective to dissipate the heat generated in those p/n junction regions.

Figure 9A:
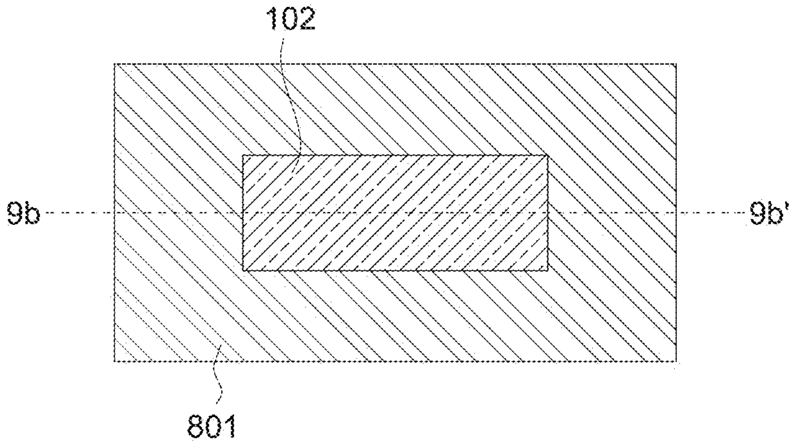
FIG. 9*a* and FIG. 9*b* illustrate a top view and a cross-section view of another embodiment after the HHDP and the VHDC are formed.
Figure 9B:
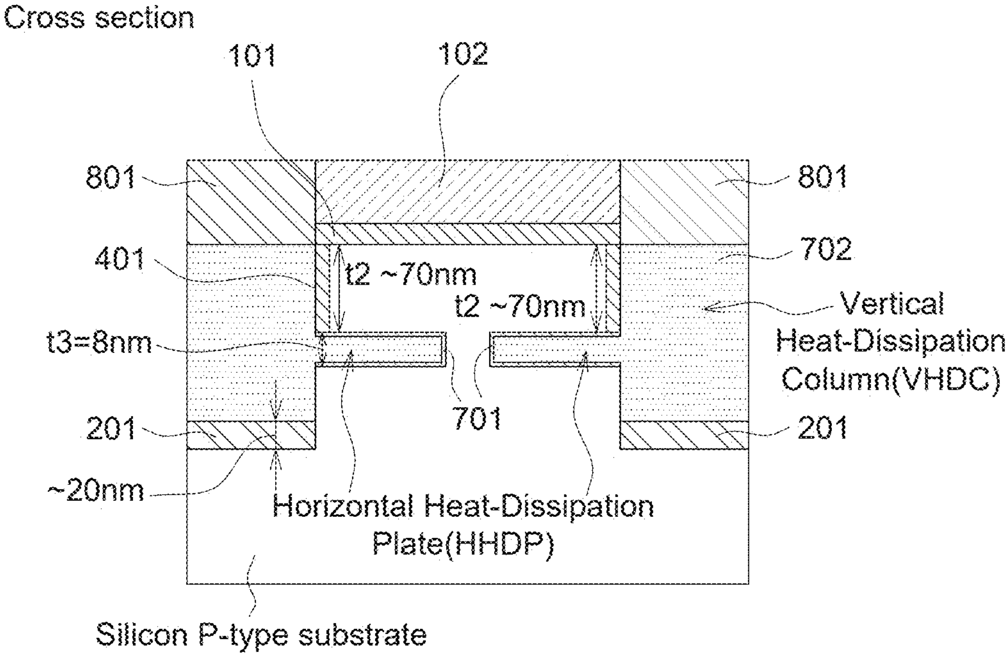

Another possibility is to use similar methods previously described to create the HHDP structure with deeper distance from the OSS (Original Silicon Surface). This can increase more HHDPs to enlarge the thermal dissipation areas. For example, after the BN material or Z material 702 is completed by CVD process, then an anisotropic etching technique can be used to take away the BN material or Z material 702 standing vertically inside the STI region 201. Then the bottom oxide material of the STI region 201 can be also taken away or etched down by using an anisotropic etching technique (e.g., only 20~50 nm-thick oxide can be retained inside the STI region without hurting the BN materials already inserted in the vacant tunnel regions 601 horizontally). Then with the second time of depositing BN material or Z material 702 into the vacancies of the STI regions, this two-step of forming BN material or Z material 702, first for HHDP, then the second for optimizing the volume of BN or Z material 702 inside almost all of STI regions (see FIG. 9, wherein the top view and the cross section are shown in 9*a* and 9*b*, respectively). Of course, before the second deposition of the Z material 702, an additional step to form a thin vertical isolating layer (just like the thin layer of oxide 401) could be applied, such that the vertical isolating layer is under the HDDP, and between sidewalls of the silicon substrate and the Z material 702.

Figure 10:
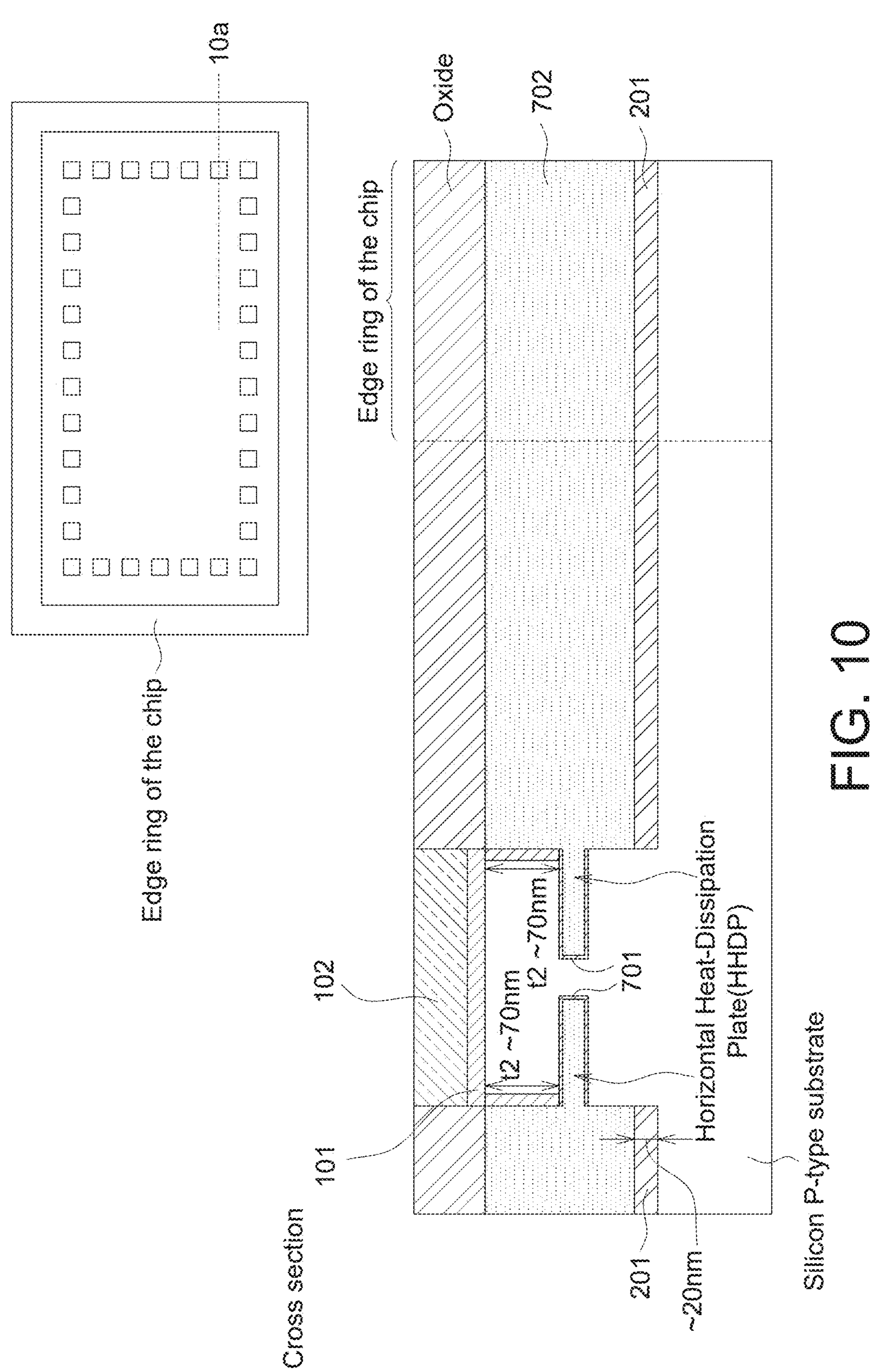
FIG. 10 is a diagram illustrating the HHDP and the VHDC are connected and extended to the edge of the chip/die.

It is also noted that, as shown in FIG. 1*a*, the STI regions are spread all over the wafer substrate. With HHDP materials all laid below the body region of MOSFETs/transistors (or in the active region) and are connected to all the VHDC material inside the STI regions, this constructed high thermal dissipation materials network can work out as the connected heat-dissipation sink from the operated PN junctions of transistors. By designing the Z material inside the monolithic die and utilizing the familiar monolithic processing recipe, all the Z material could be connected to an edge ring of the chip or die, and then the Z material 702 inside STI region can be contacted by opening its top surface so that an entire die's Z material 702 can be thermally connected to the outside edge of the chip/die for even more directly and effectively dissipating the heat, see FIG. 10, wherein the bottom figure of FIG. 10 is the cross section view along the cut line 10*a* shown in the top figure of FIG. 10. Therefore, the VHDC in the STI region (and/or HHDP in the active region) is a kind of Direct Die Heat Remover ("DDHR"), and the present invention provides Direct Die Cooling Technology ("DDCT") based on the proposed VHDC (and/or HHDP).

There are many active regions in the semiconductor substrate, and in the present invention, the active region (or a plurality of active regions) is surrounded by the Z material 702. The Z material 702 extends from one active region to another active regions, and further extends to the edge of the chip/die. Each active region could accommodate the circuit element, such as transistors. In another embodiment, the die/chip with the VHDC (and/or the HHDP) could be thinned first and then opened to reveal the VHDC (and/or the HHDP), such that another substrate with thermal vias or heat sink could be connected to the VHDC (and/or the HHDP) from the bottom of the die/chip.

Figure 11:
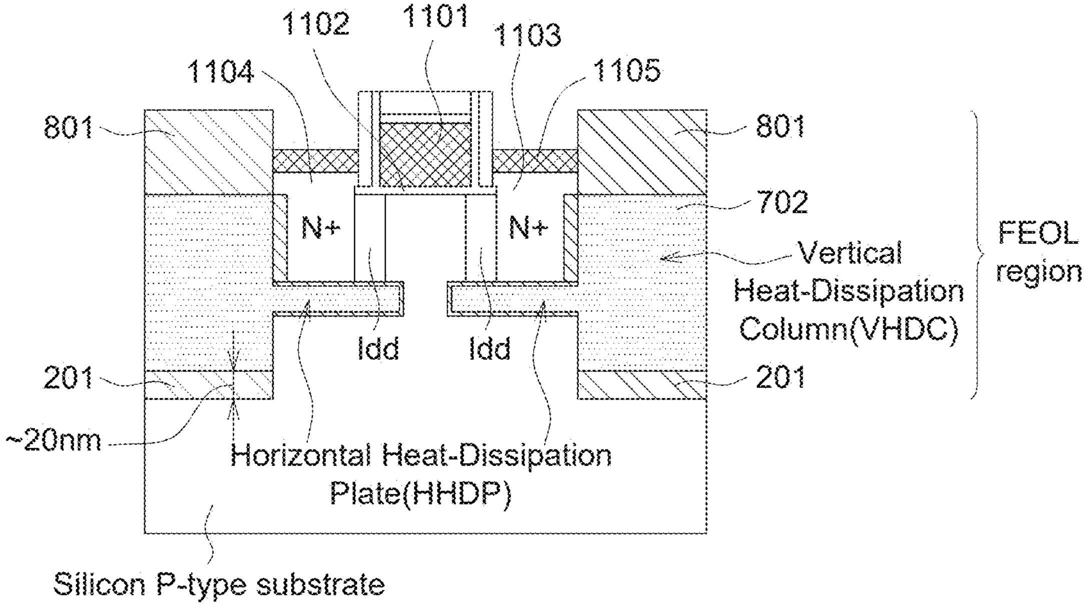
FIG. 11 is a diagram illustrating a cool transistor according to the present invention.

After the structure of VHDC (and/or the HHDP) is completed by portion of front end of line (FEOL) processes, the rest of FEOL foundry processes could be used to form the transistors in the active region, as shown in FIG. 11. The diffusion regions (or source/drain region) of the transistor are contacted or almost contacted to the VHDC (and/or the HHDP). Thus, it could be described that the VHDC (and/or the HHDP) is formed during the FEOL processes of the foundry manufacturing methods, or within the FEOL region of the semiconductor die.

In FIG. 11, the transistor comprises a gate structure which includes a gate metal region 1101 and a Hi-K dielectric 1102. The transistor also comprises a source region 1103 which includes a lightly-doped region laterally extending from a sidewall of the substrate and a heavily-doped region laterally extending from the sidewall of the lightly-doped region. Those lightly-doped region and heavily-doped region are formed by selective growth methods, such as epitaxial growth methods. Over the top of the source region 1104 there is a metal contact 1105 between the gate structure of the transistor and the STI region 801. It is noticed that the top surface of the STI region 801 is higher than the OSS (such as level up with the top of the gate structure), such that a contact hole is automatically formed without using photo lithography process to form such contact hole, and therefore the metal contact 1105 would be self-aligned with the source region 1103. Moreover, in another embodiment, the metal contact 1105 could not only be connected to the top of the source region 1103, but also connected to the most lateral sidewall of the source region 1103. The transistor also comprises a drain region 1104 the structure of which is the same or substantially the same as that of the source region 1103, and the description thereof is omitted. FIG. 11 shows the final transistor structure with the HHDP and VHDC microstructures for a new "Cool Transistor (CQT)" which is the best term to describe one embodiment of the present invention. Such a CQT structure can realize the scaling-up (more transistors) and scaling-down (smaller transistor size) strategy from present GSI (GigaScale Integration) to the near-future TSI (Tera Scale Integration) era. The newly created thermal dissipation path for a chip or die is directly to generate heating paths from a transistor level to the entire die level. There is some design which can connect the die-level thermal path to a chip-level thermal path which can certainly be an effective heat-dissipation sink for a chip package and/or for some heterogeneous integration module (e.g., Through TSV or TIV, etc.) under the present cooling method out of die and package/heterogeneous integration module.

Figure 12A:
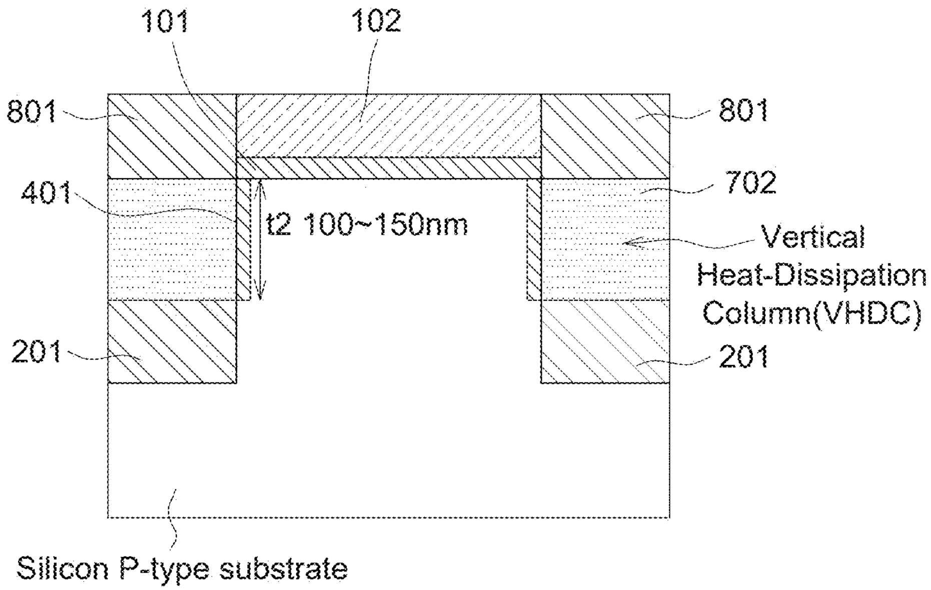
FIG. 12*a* and FIG. 12*b* illustrate cross-section views of different embodiments of the present invention.

Furthermore, in another embodiment, the processes to form the Horizontal Heat-Dissipation Plate (HHDP) could be skipped and only the Vertical Heat-Dissipation Columns (VHDC) are constructed. For example, please refer to FIG. 2, the STI region 201 could be first etched down to reveal sidewalls of the Si substrate such that the remained depth of the STI material is around 150~200 nm, then the thin thermal oxide layer 401 could be formed along the revealed sidewalls of the Si substrate. Afterward, the Z material 702 could be deposited and etched back with a depth of 100~150 nm to form the VHDC, and additional oxide 801 or other isolating material is deposited over the VHDC, as shown in FIG. 12*a*.

Figure 12B:
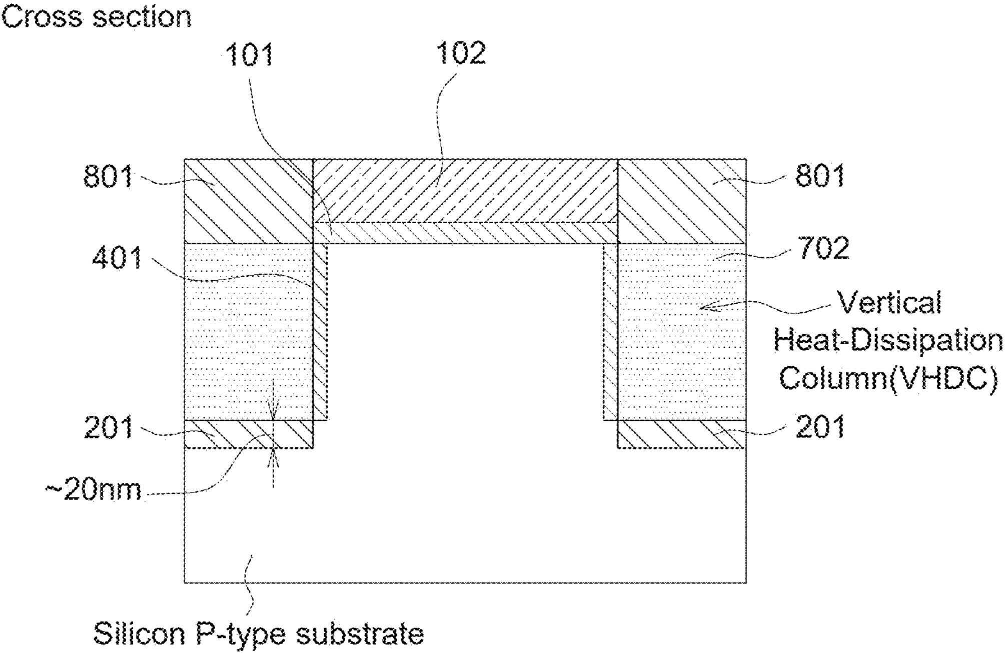
Figure 12C:
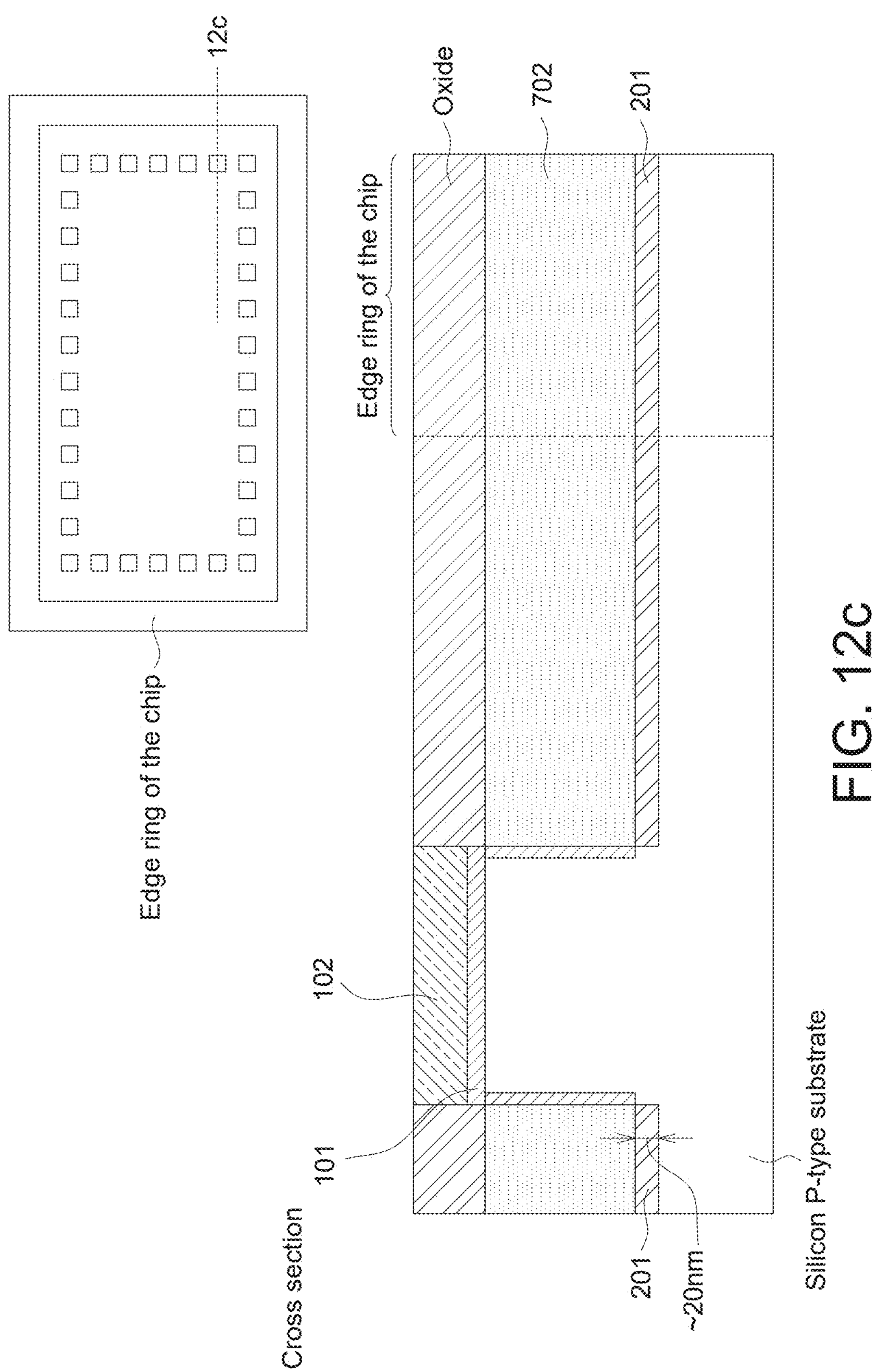
FIG. 12*c* is a diagram illustrating the VHDC of FIG. 12*b* extends to the edge of the chip/die according to another embodiment of the present invention.

FIG. 12*b* shows a cross section view regarding VHDC in STI region of another embodiment according to the present invention. The difference between FIG. 12*b* and FIG. 12*b* is that, most of $SiO_2$ material in STI region are replaced by VHDC. Conventionally, the depth of STI region, starting from the original semiconductor surface (OSS) of the die, is 250~300 nm. In FIG. 12*b*, only 20~50 nm of $SiO_2$ material is left in the lower portion of STI region, however, there is 150~200 nm depth of $SiO_2$ material left in the lower portion of STI region shown in FIG. 12*a*. The more $SiO_2$ is replaced by the VHDC, the higher of the heat conductivity of the die structure. Of course, the top of the VHDC could be lower or higher than the OSS. Similarly, the VHDC structure in FIG. 12*a* or FIG. 12*b* could extend along all STI regions within the semiconductor die as well, as shown in FIG. 12*c*, wherein the bottom figure of FIG. 12*c* is the cross section view along the cut line 12*c* shown in the top figure of FIG. 12*c*.

Figure 13:
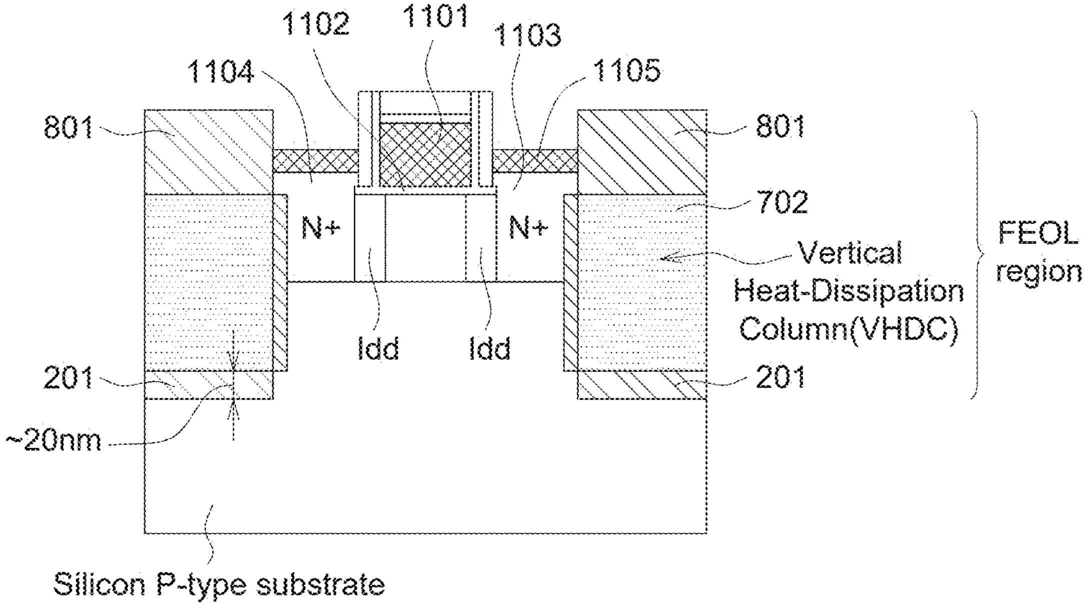
FIG. 13 is a diagram illustrating another cool transistor according to FIG. 12*b*.

FIG. 13 shows another Cool Transistor, and the difference between the FIG. 13 and FIG. 11 is that, the Cool Transistor of FIG. 13 is based on the VHDC in STI region shown in FIG. 12*b*. The other descriptions of the Cool Transistor of FIG. 13 are the same as those of the Cool Transistor of FIG. 11, and the details of which are skipped for simplicity.

As previously mentioned, the VHDC or the Z material could be made of a single high thermal dissipation material, and could be made of a composite structure as well. For example, the VHDC comprises a layer of first high thermal dissipation material (such as BN, AlN, etc., not shown in FIG. 12*a* or FIG. 12*b*) and another metal or metal-like column covered by the first high thermal dissipation material. Since the VHDC is within the STI region and the metal-like material is surrounded by the first high thermal dissipation material which is a non-conductive during the operation of the transistors in the die/chip (and in this situation, the thin thermal oxide layer 401 may be skipped), the metal-like material of the VHDC will not impact the operation of the transistors in the die/chip. Of course, both the first high thermal dissipation material and the metal or metal-like column could further extend to edges of the die/chip, and form heat dissipation network as previously mentioned. Therefore, there is a composite-material STI region (including the original STI material $SiO_2$ and the VHDC; just including just VHDC which is a composite material with two different layers) or Heterogeneous STI (HSTI) region in the semiconductor structure according to the present invention.

Furthermore, in one embodiment, all or most of the STI regions in FIG. 1*a* could be replaced by the composite-material STI region, such that four sidewalls of the active region are surrounded by the composite-material STI region. Such composite-material STI region extends from one active region to another active regions, and further extends to the edge of the chip/die. In another embodiment, a peripheral border of a first set of active regions is surrounded by the composite-material STI region which extends to a second set of active regions, and further extends to the edge of the chip/die.

Figure 14A:
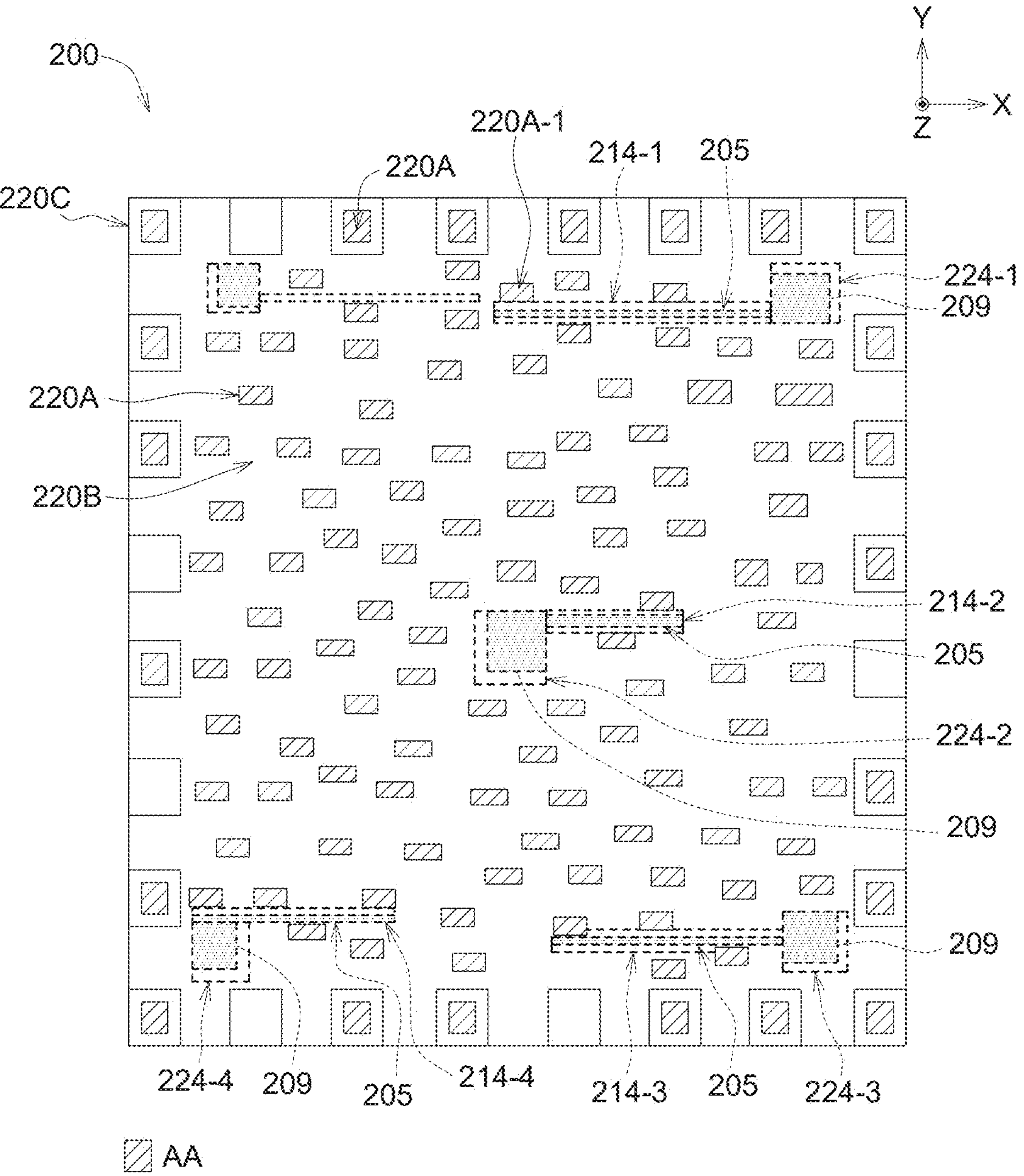
FIG. 14*a* illustrates a schematic top view of a semiconductor circuit structure according to some embodiments of the present disclosure.

FIG. 14*a* illustrates a schematic top view of a semiconductor circuit structure 200 in the substrate according to one embodiment of the present disclosure. The semiconductor circuit structure 200 can be formed within a semiconductor chip or substrate. FIG. 14*a* shows more active areas or active regions 220A, STI regions 220B, and pad open layers 220C which may accommodate contacting pads of the semiconductor circuit structure 200. Some big STI regions 224-1~224-4 of the STI regions 220B could be located at corner area adjacent to peripheral/edge area of the semiconductor chip, or at center spare area of the chip. Big VHDC structures (such as VHDC pads) 209 are located within the big STI regions 224-1~224-4 and positioned under the original semiconductor surface of the semiconductor substrate. Additionally, other thin or long VHDC structures (such as VHDC line) 205 are positioned under the original semiconductor surface of the semiconductor substrate and formed within those thin or long STI regions 214-1~214-4 of the STI region 220B. The VHDC structures 205 and the STI regions 214-1~214-4 may extend along the X direction (or along the length direction of active areas). Furthermore, the VHDC structure 205 may extend over two or more active regions 220A, e.g., the VHDC structure 205 located on the top-right portion of FIG. 14*a* extends from one predetermined point adjacent to the active area 220A-1 to the big STI region 224-1.

In FIG. 14*a*, on one side of the STI regions 214-1, there is a first set of active regions extending along the x direction; and one the other side of the STI regions 214-1, there is a second set of active regions extending along the x direction as well. Thus, the STI regions 214-1 is between the first set of active regions and the second set of active regions, and extends along the x direction. Moreover, the VHDC structure 205 within the STI regions 214-1 is also between the first set of active regions and the second set of active regions and extends along the x direction. In one embodiment, the smallest one and/or the longest width of the VHDC structure 205 (such as, along the y direction) between the first set of active regions and the second set of active regions is smaller than the width of the VHDC structure 209 (such as, along the y direction) connected to the VHDC structure 205.

Furthermore, each of the STI regions 214-1~214-4 may neighbor a set of transistors in a plurality of active areas 220A, and the big STI region 224-1 may be remote from the set of transistors. The VHDC structure 205 is coupled to or directly connected to the VHDC structure 209.

The width of the VHDC structure 209 along the Y direction is greater the width of the VHDC structure 205 along the Y direction. For example, the width of the VHDC structure 209 along the Y direction may range from about 2 μm~8 μm. The width of the VHDC structure 205 along the Y direction may range from about 10 nm~100 nm. The area of the VHDC structure 209 may range from about 4 $\mu m^2$ to about 50 $\mu m^2$. The materials of the VHDC structures 205 and 209 may be the same or different.

Figure 14B:
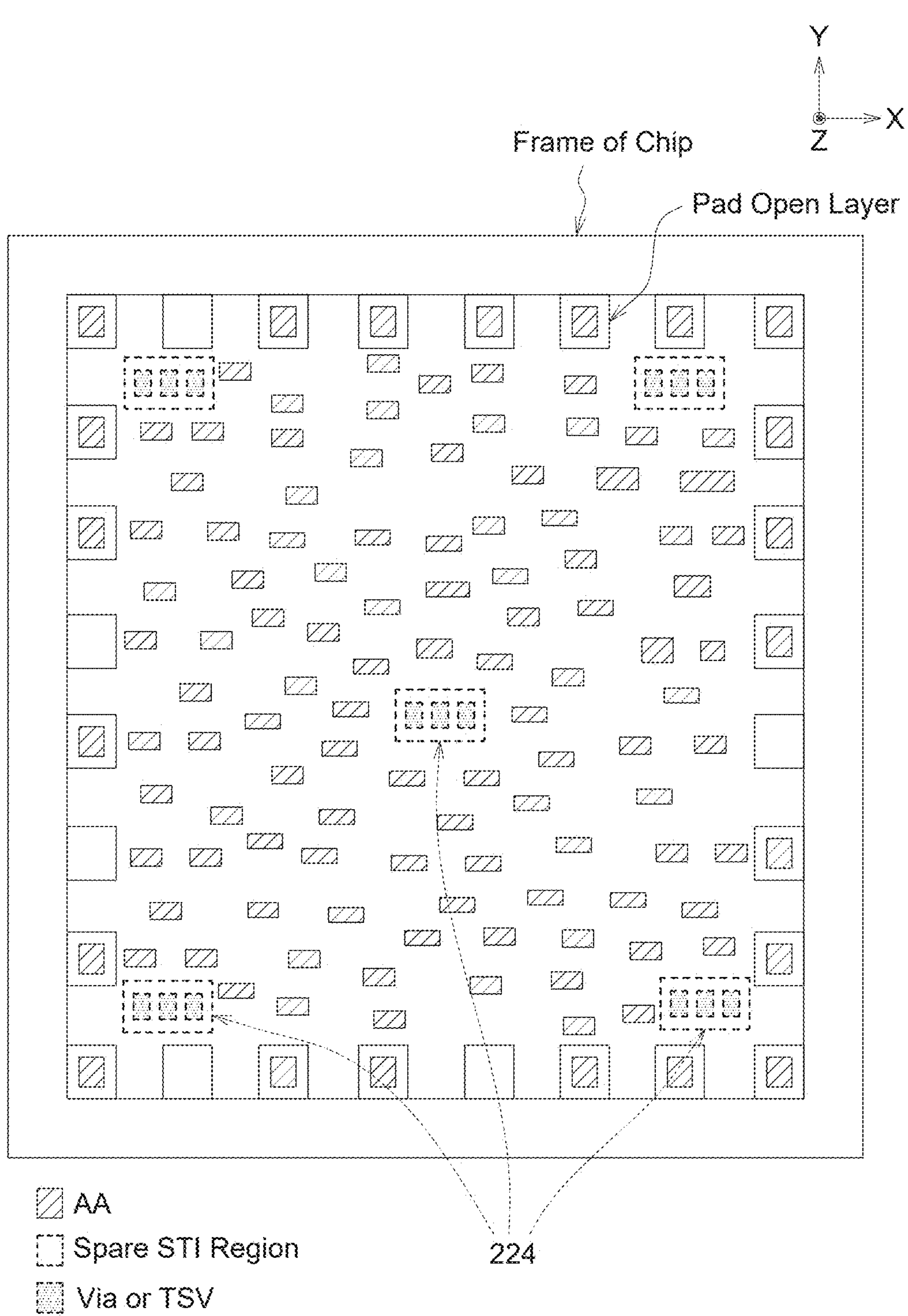
FIG. 14*b* illustrates a schematic top view of a semiconductor circuit structure according to some embodiments of the present disclosure.

The spare or big STI regions 224 may form extra alignment marks for the backside through silicon vias (TSVs) or thermal vias extending from the bottom of the big STI regions 224 to the bottom side of the substrate, as shown in FIG. 14*b*. Those TSVs pr thermal vias are right under and connected to the big size VHDC pads within the big STI region 224. The area of the spare or big STI regions 224 is big enough to accommodate one or more TSVs or thermal vias therein. Of course, those spare or big STI regions 224 may also form extra alignment marks for the topside TSVs or thermal vias extending from the top of the big STI regions 224 to the top side of the substrate. Those thermal vias are right above and connected to the big size big size VHDC pads within the spare STI region. The TSVs or thermal vias of the present invention could be made by the back end of line (BEOL) foundry processes and connected to the big size VHDC pads. Thus, it could be described that the TSVs or thermal vias are formed during the BEOL processes of the foundry manufacturing methods, or within the BEOL region of the semiconductor die.

Figure 15A:
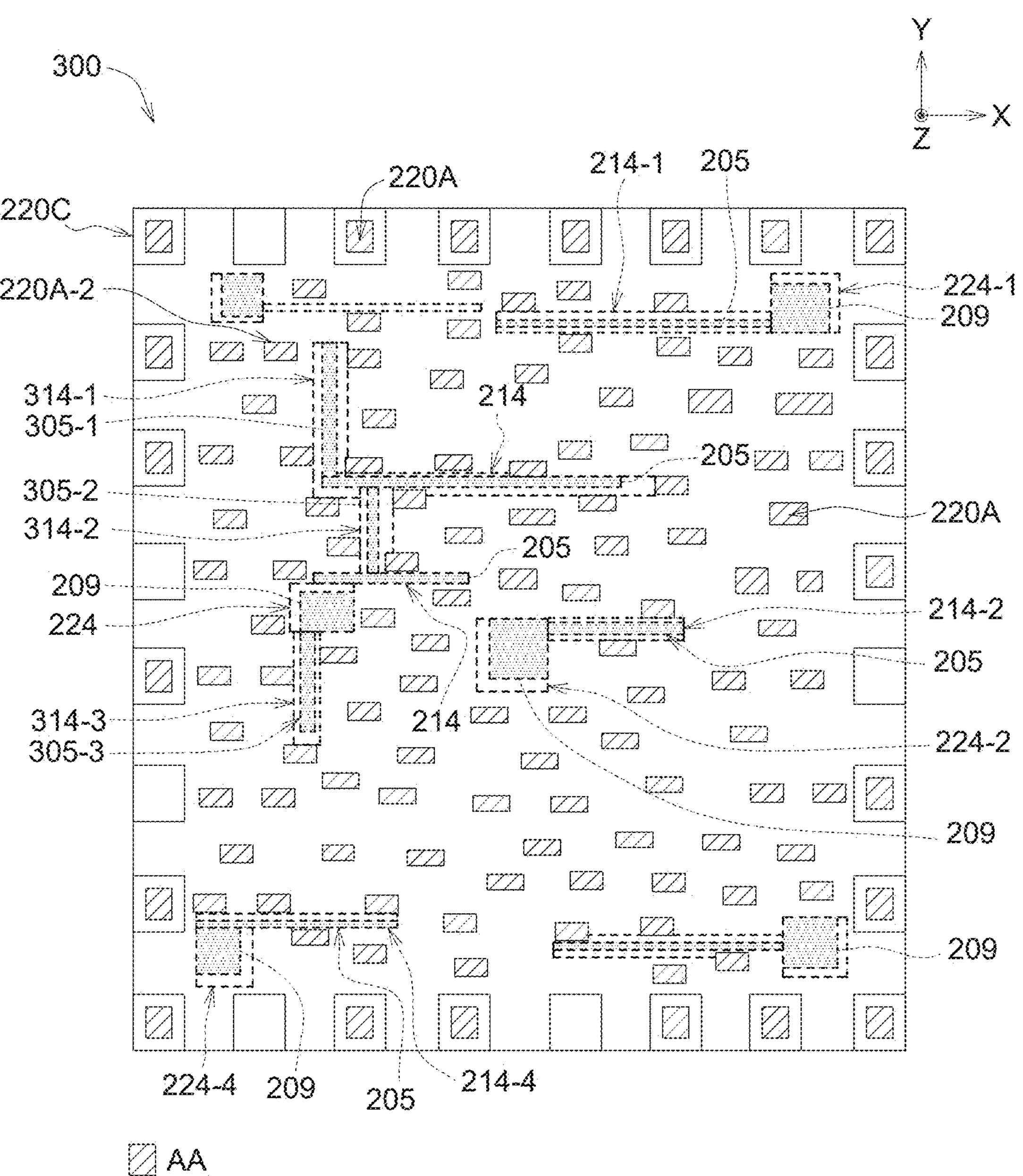
FIG. 15*a* illustrates a schematic top view of a semiconductor circuit structure according to some embodiments of the present disclosure.

In other embodiments, the VHDC structures may extend along directions other than the X direction, as shown in FIG. 15*a*. FIG. 15*a* illustrates a schematic top view of a semiconductor circuit structure 300 according to some embodiments of the present disclosure. As compared with the semiconductor circuit structure 200 shown in FIG. 14*a*, the semiconductor circuit structure 300 shown in FIG. 15*a* further includes STI regions 314-1, 314-2 and 314-3, and VHDC structures 305-1, 305-2 and 305-3 extending along the Y direction. The VHDC structures 305-1, 305-2 and 305-3 are positioned under the original semiconductor surface of the semiconductor substrate and formed within the STI regions 314-1, 314-2 and 314-3, respectively. The VHDC structures 305-1, 305-2 and 305-3 can be VHDC lines. The VHDC structures 305-1, 305-2 and 305-3 and the STI regions 314-1, 314-2 and 314-3 may extend along the Y direction (or along the width direction of active areas). Furthermore, the VHDC structure 305-1, 305-2 and 305-3 may extend over two or more active regions 220A, e.g., the VHDC structure 305-1 located on the top-left portion of FIG. 15 extends from one predetermined point adjacent to the active area 220A-2 to the horizontal STI region 214. Each of the STI regions 314-1, 314-2 and 314-3 may neighbor a set of transistors in the active areas 220A.

In FIG. 15*a*, the VHDC structures extending along directions other than the X direction may be connected to (or electrically coupled to) the VHDC structures extending along the X direction and/or the VHDC pads within the big STI regions. For example, the VHDC structure 305-1 is connected to (or electrically coupled to) the VHDC structure 205; the VHDC structure 305-2 is connected to (or electrically coupled to) two VHDC structures 205 and between these two VHDC structures 205; the VHDC structure 305-3 is connected to (or electrically coupled to) the VHDC pad 209 within the big STI region 224. The VHDC structures 305-1, 305-2 and 305-3 can be similar in size and material to the VHDC structures 205.

With the arrangement of the VHDC structures/lines extending along the X direction, the VHDC structures/lines extending along the Y direction (or directions other than the X direction), and the VHDC pads within the big STI regions, an VHDC mesh within the chip or the semiconductor substrate and under the original semiconductor surface of the semiconductor substrate (or called as "Direct Die Cooling Technology") is provided. The VHDC structures extending along the X direction (i.e., the horizontal VHDC lines) can be used to connect the VHDC structures within the big STI regions (i.e., the VHDC pads), and the VHDC structures extending along the Y direction (i.e., the vertical VHDC lines) can be used to connect the VHDC pads or the horizontal VHDC lines.

Figure 15B:
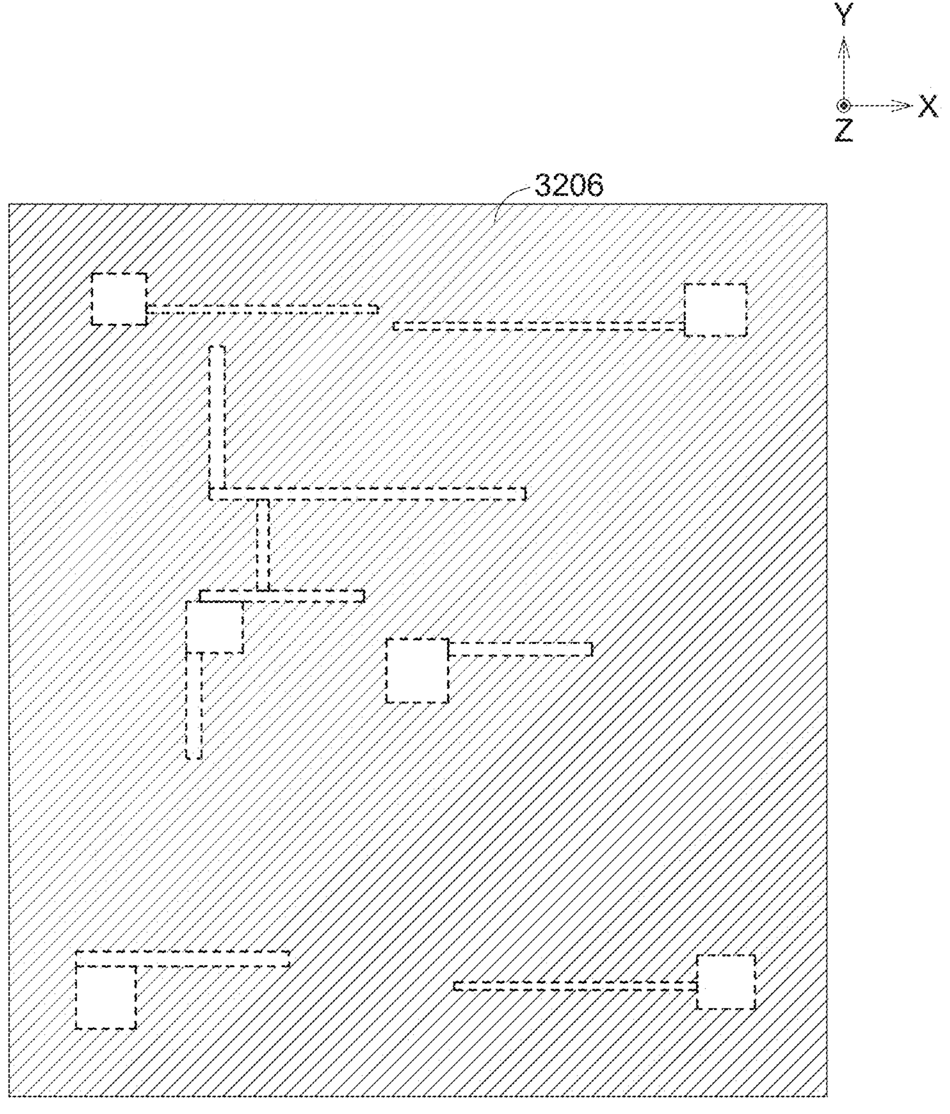
FIGS. 15*b* to 15*c* illustrate schematic top views of structures at different stages of the manufacturing method for the semiconductor circuit in FIG. 15*a.*
Figure 15C:
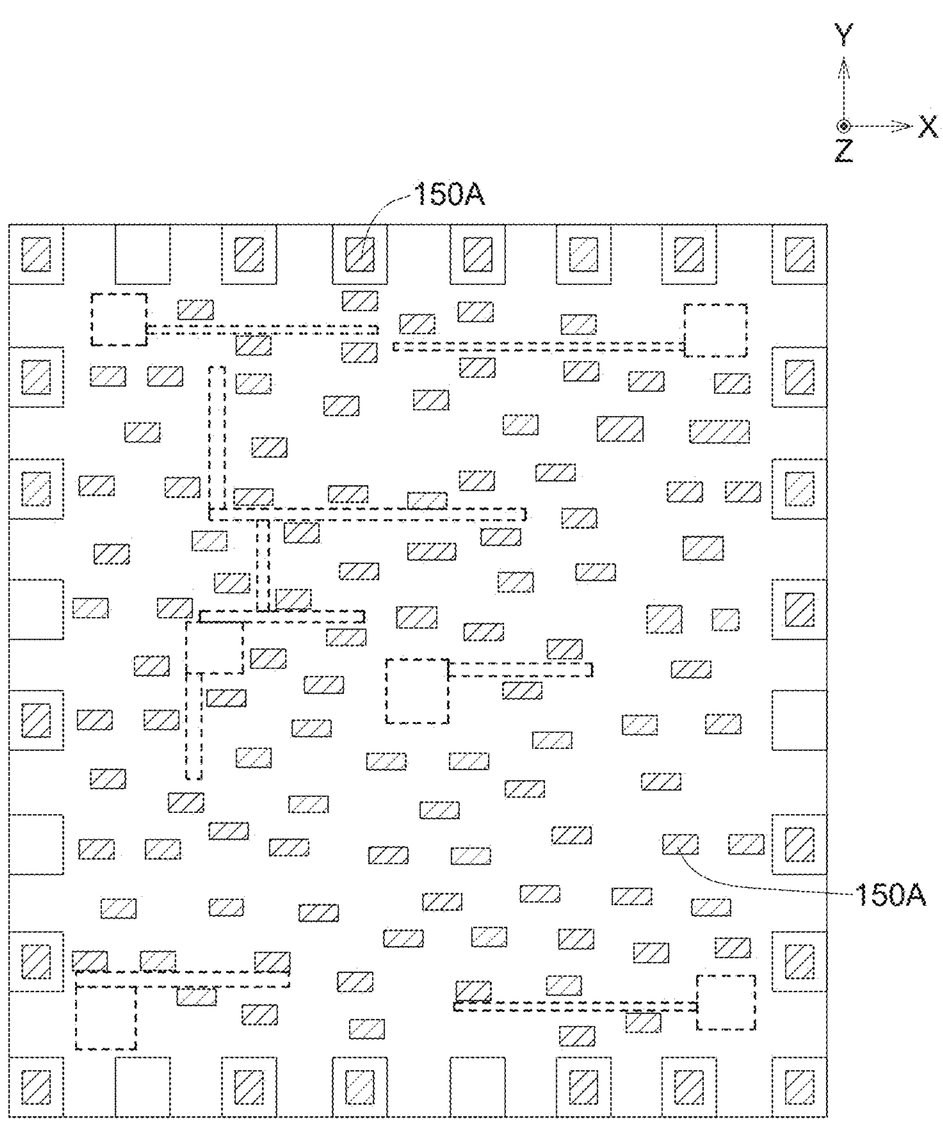

In some embodiments, the VHDC structures extending along directions other than the X direction, such as the VHDC structures 305-1, 305-2 and 305-3 shown in FIG. 15*a*, can be manufactured through the follow steps. FIGS. 15*b* to 15*c* illustrate schematic top views of structures at different stages of the manufacturing method. A pad-oxide layer (not shown) and a pad-nitride layer 3206 are sequentially deposited on the semiconductor substrate. Then, temporary active areas could be firstly defined by a photolithographic process, and the temporary STI regions and the big STI regions (indicated by dotted lines in FIG. 15*b*) can be defined outside the temporary active areas. The Z material is then formed in the temporary STI regions and the big STI regions. Then, true active areas 150A can defined by another photolithographic process, and the removed temporary active areas then be used for rest STI regions, as shown in FIG. 15*c*.

The position, size, number of the VHDC structures are not limited to those shown in FIGS. 14 and 15*a*. As mentioned, for heat dissipation application, the VHDC structures can include (or can be made of) high thermal conductivity materials such as tungsten (having a thermal conductivity around 170 W/m·K), boron nitride (BN, having a thermal conductivity around 600 W/m·K), aluminum nitride (AlN, having a thermal conductivity around 321 W/m·K). It is also possible that other material with thermal conductivity higher than the original material (silicon dioxide) of STI region could be used, such as SiC, SiGe, undoped Si, or deposited diamond. In some embodiments, the VHDC structures can include (or can be made of) composite materials including two or more high thermal conductivity material. In the present invention, portion of silicon dioxide in the original STI regions can be replaced by the VHDC structures, thereby improving the ability of heat dissipation due to the thermal conductivity of the materials of the VHDC structures are higher than silicon dioxide and/or silicon.

As shown in FIG. 15*a*, the VHDC structures used for heat dissipation extend from some STI regions next to active areas in which transistors are located to the big STI regions in which the VHDC pads (for example, the area of the VHDC pad may range from about 4 $\mu m^2$ to about 50 $\mu m^2$) are located. In another example, all VHDC structures can be thermally coupled together. For example, the VHDC structure in the big STI region (i.e., the VHDC pad) can be thermally coupled to the VHDC structure in the STI region (i.e., the VHDC line). Furthermore, the big STI regions can be adopted to align with one or more thermal vias as shown in FIG. 14*b*. Moreover, all or most of STI regions (such as more than 60%, or even 70%~90%) in the semiconductor chip could be filled with the proposed VHDC structures for heat dissipation purpose.

Figure 16A:
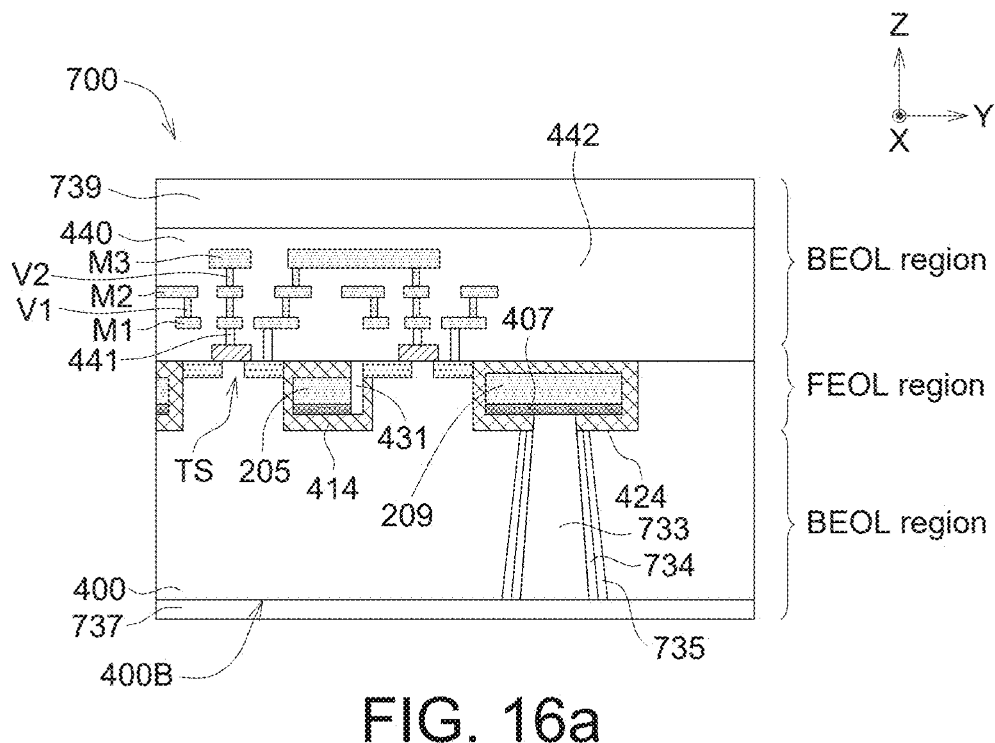
FIGS. 16*a*~16*f* illustrates schematic cross-sectional views of different semiconductor circuit structures according to some embodiments of the present disclosure.

FIG. 16*a* illustrates a schematic cross-sectional view of a semiconductor circuit structure 700 according to some embodiments of the present disclosure. The semiconductor circuit structure 700 includes an upper interconnection structure 440 over the semiconductor substrate 400. The upper interconnection structure 440 includes a contact structure 441, metal layers M1 to M3, connecting vias V1 and V2, and a dielectric layer (or a set of insulator layers) 442. The contact structure 441, the metal layers M1 to M3, and the connecting vias V1 and V2 are in the dielectric layer 442 which may include multiple dielectric sub-layers. The contact structure 441 is between the transistor TS and the metal layer M1. The metal layers M1 to M3 are sequentially positioned above the original semiconductor surface OSS of the semiconductor substrate 400 along the Z direction. The metal layers M1 to M3 are vertically separately from each other. The connecting vias V1 and V2 are positioned above the original semiconductor surface OSS of the semiconductor substrate 400. The connecting via V1 is between the metal layers M1 and M2. The connecting via V2 is between the metal layers M2 and M3. The metal layers M1 to M3 and the connecting vias V1 and V2 are electrically connected to each other.

The semiconductor circuit structure 700 further includes a backside TSV 733 right under and connected to the second VHDC structure 209 (i.e. the VHDC pad which includes composite layers as shown in FIG. 16*a*) within the big STI region 424, a heat dissipation film 734 on a sidewall of the TSV 733, a barrier or isolating film 735 on a sidewall of the heat dissipation film 734, a heat dissipation plate 737 located on or close to the backside surface 400B of the semiconductor substrate 400 (or on the backside of the chip), and a top heat dissipation plate 739 above the upper interconnection structure 440. The TSV 733 is used for heat dissipation and can be understood as a (backside) thermal via. The heat dissipation plate 737 can be a heat sink and the material of which could be the same as that of the heat dissipation film 734 or the TSV 733. The TSV 733 extends from the bottom surface of the second VHDC structure 209 to the backside surface 400B of the semiconductor substrate 400. The TSV 733 is connected between the second VHDC structure 209 and the heat dissipation plate 737 to form a heat dissipation path which includes the second VHDC structure, the TSV 733 and the heat dissipation plate 737.

For heat dissipation, the VHDC structures in the present embodiment may include (or may be made of) materials having thermal conductivities higher than the thermal conductivity of $SiO_2$. For example, the VHDC structures may include tungsten, copper, BN, AlN, SiC, SiGe, or deposited diamond, undoped Si, or the combination thereof. In some embodiments, the VHDC structures include isolation material with a thermal conductivity higher than the thermal conductivity of Si. The TSV 733 may include copper, and the heat dissipation film 734 could be BN or AlN.

Furthermore, the TSV 733 are directly connected to the second VHDC structures 209, the second VHDC structures 209 are then connected to the first VHDC structures 205 (that is, the VHDC line which includes composite layers as shown in FIG. 16*a*) in the STI isolation 414, and the first VHDC structures 205 could be further connected to the transistors (such as source/drain regions of the transistors) through the corresponding connecting plug 431. As such, heat generated from the transistor can be dissipated through the connecting plug 431, the first VHDC structure 205, and the second VHDC structure 209 to the TSV 733. Thus, an VHDC heat dissipation network with high heat dissipation efficiency is provided. In another embodiment, the VHDC structures may be isolated from the transistors, but the heat dissipation purpose could be reached through the VHDC lines, the VHDC pads, and the TSV 733.

The VHDC 205 within and extended along the STI region 414 can be connected to, through a self-aligned or self-constructed method, the source or drain terminal of the transistor through the connecting plug 431 which is within the active area accommodating the transistor. The connecting plug 431 is connected to a sidewall of the VHDC structure.

The conventional semiconductor circuit structure only includes upper thermal vias in the upper interconnection structure 440 and does not include VHDC structures, especially the VHDC pads. Therefore, the alignment of the upper thermal vias is a critical issue. In addition, the upper thermal vias of the conventional semiconductor circuit structure are just positioned within and isolated by the dielectric layer 442 of the upper interconnection structure 440, and those upper thermal vias are remoted from the transistors. Thus, the heat generated from the transistors is difficult to be dissipated efficiently. However, the semiconductor circuit structure according to the present disclosure provides bigger alignment window for the thermal vias through the help of VHDC pads. Moreover, the thermal coupling path between the thermal vias and the source/drain terminal of the transistors are shorter through the help of VHDC structures. Therefore, heat generated from the transistors can be dissipated efficiently through the configuration of the present disclosure.

Figure 16B:
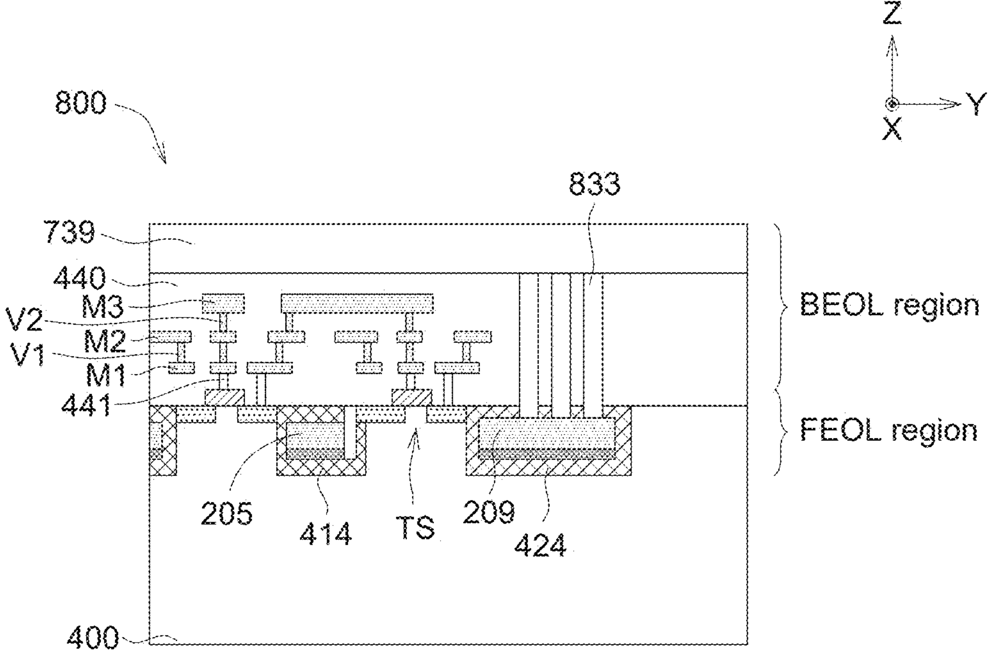

FIG. 16*b* illustrates a schematic cross-sectional view of a semiconductor circuit structure 800 according to some embodiments of the present disclosure. The semiconductor circuit structure 800 includes upper or topside thermal vias 833 in the dielectric layer 442 of the upper interconnection structure 440. The upper thermal vias 833 extend upward from the upper surface of the second VHDC structure 209 to the top heat dissipation plate 739 and penetrate the dielectric layer 442 of the upper interconnection structure 440.

Thus, the upper thermal vias 833 are connected the second VHDC structure 209 (the VHDC pads in the STI isolation 424), the second VHDC structure 209 is then connected to the first VHDC structures 205 (that is, the VHDC lines in the STI isolation 414), and the first VHDC structures 205 are connected to the transistors (such as source/drain regions of the transistors) through the corresponding connecting plug 431. Therefore, the top heat dissipation plate 739, the upper thermal vias 833, the first VHDC structures 205 and the second VHDC structures 209 could form a heat dissipation path for the heat generated by the transistors. As such, heat generated from the transistor can be dissipated through the connecting plug 431, the first VHDC structure 205, and the second VHDC structure 209 to the upper thermal vias 833. An VHDC heat dissipation network with high heat dissipation efficiency is provided according to the present direct heat cooling technology. In another embodiment, the VHDC structures 205 (the VHDC lines in the STI isolation 414) may be isolated from the transistors, but the heat dissipation purpose could still be reached. In other embodiments, the upper thermal vias 833 can extend from the upper surface of the upper interconnection structure 440 to the first VHDC structures 205. Furthermore, the material of the upper thermal via 833 may be the Z material having a thermal conductivity higher than Si or $SiO_2$, such as copper, and the material of the upper thermal via 833 could be the same as or different from the material of the top heat dissipation plate 739.

Figure 16C:
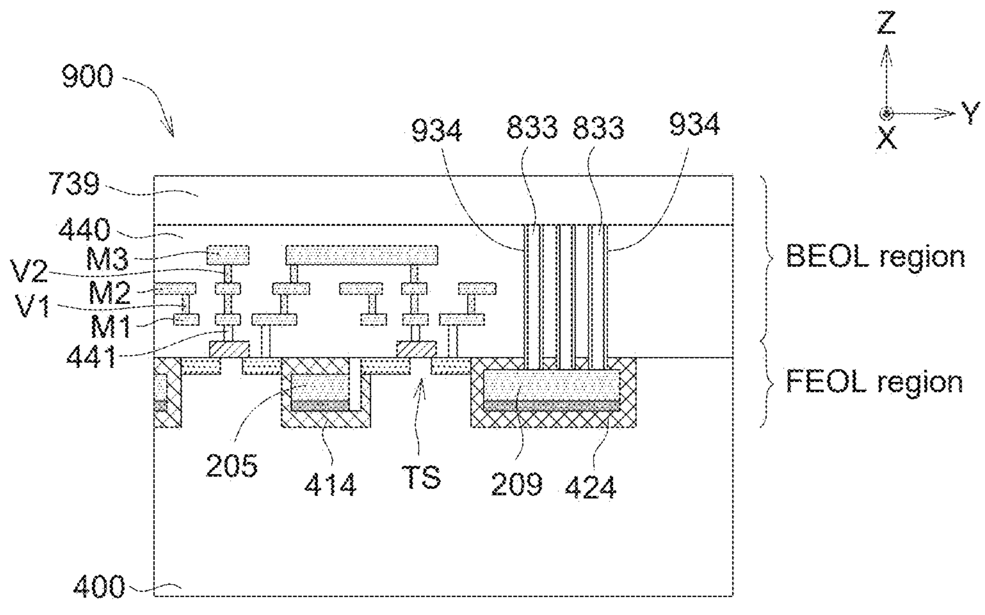

FIG. 16*c* illustrates a schematic cross-sectional view of a semiconductor circuit structure 900 according to some embodiments of the present disclosure. The difference between the semiconductor circuit structure 900 shown in FIG. 16*c* and the semiconductor circuit structure 800 shown in FIG. 16*b* is that, the semiconductor circuit structure 900 includes upper heat dissipation films 934 on sidewalls of the upper thermal vias 833. The upper heat dissipation film 934 may include (or may be made of) a material having a thermal conductivity higher than Si or $SiO_2$, such as BN or AlN. Configuring upper heat dissipation film 934 on the upper thermal via 833 can improve heat dissipation efficiency.

Figure 16D:
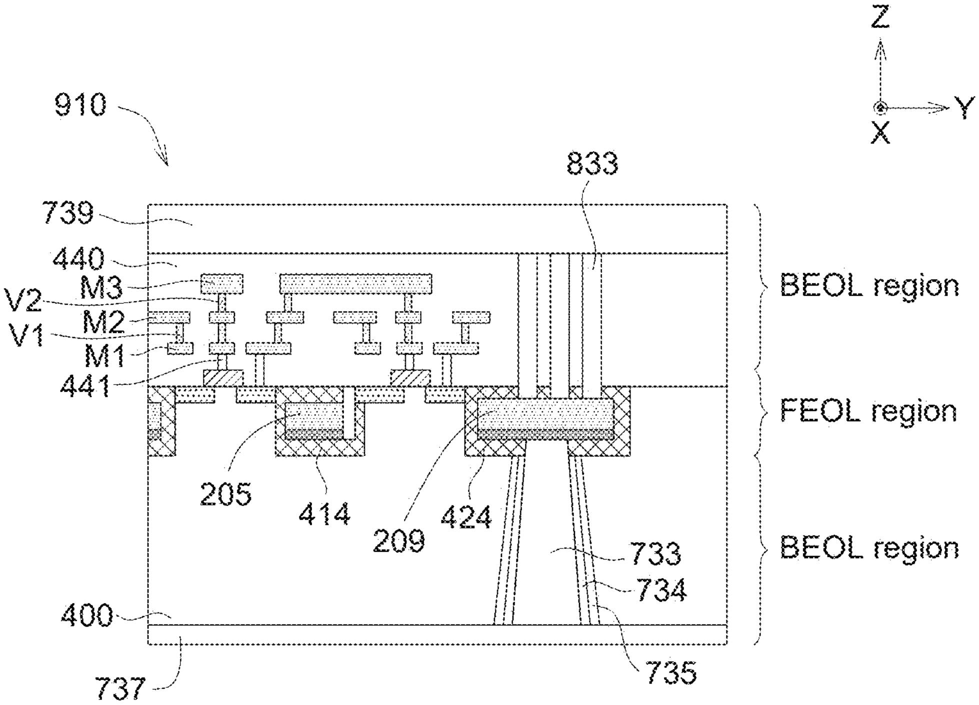

In some embodiments, the TSV 733 shown in FIG. 16*a* and the upper thermal via 833 shown in FIG. 16*b* (or the upper heat dissipation films 934 and the upper thermal vias 833 in FIG. 16*c*) can be combined together, as shown in FIG. 16*d*. In the semiconductor circuit structure 910 shown in FIG. 16*d*, some upper thermal vias 833 extend from the upper surface of the upper interconnection structure 440 to the second VHDC structure 209, and are connected to the top heat dissipation plate 739. The TSV 733 (additional thermal vias) extends from the backside surface 400B of the semiconductor substrate 400 to the second VHDC structure 209 (or other VHDC structure), and are connected to the heat dissipation plate 737 located on or close to the backside surface 400B of the semiconductor substrate 400. Such sandwich structure (with middle VHDC structures in the chip, the top heat dissipation plate connected to the middle VHDC structures, and the heat dissipation plate on the backside surface of the semiconductor substrate and connected to the middle VHDC structures) can greatly enhance the ability of heat dissipation of the IC chip.

Figure 16E:
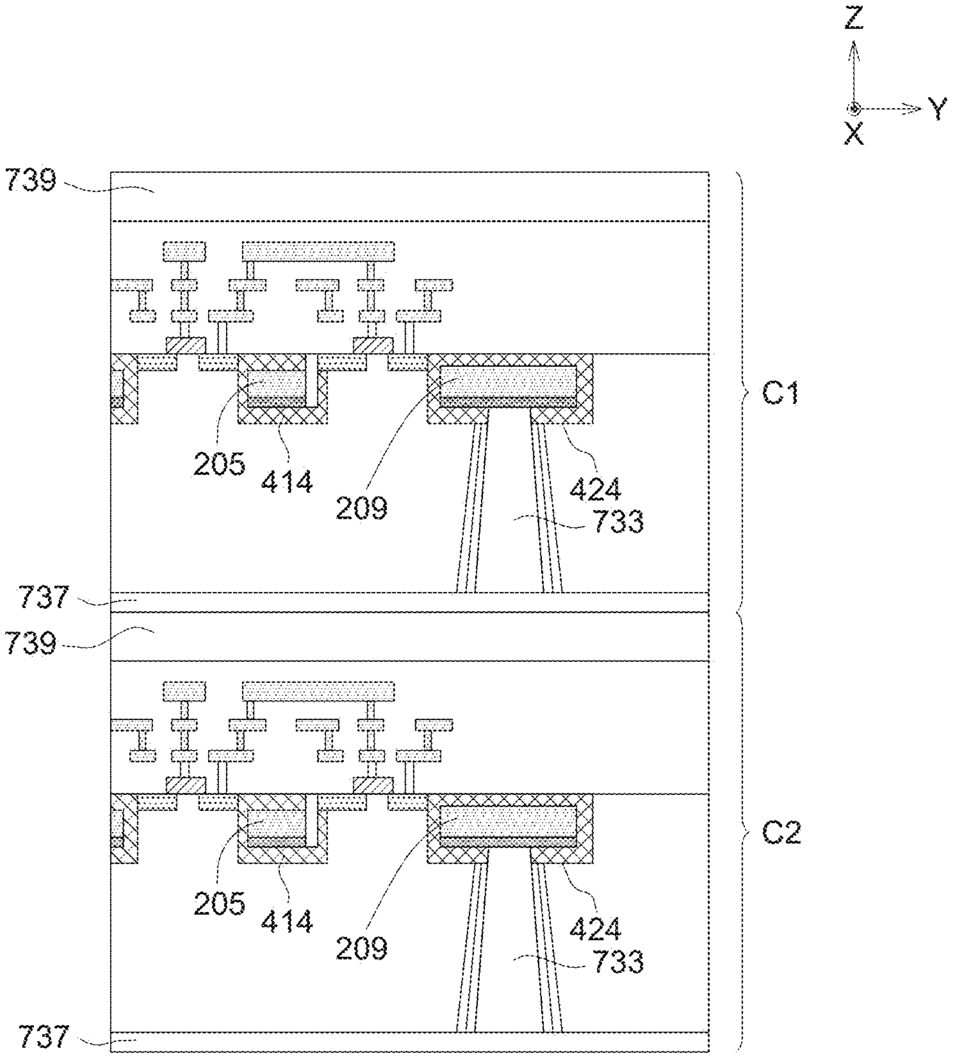
Figure 16F:
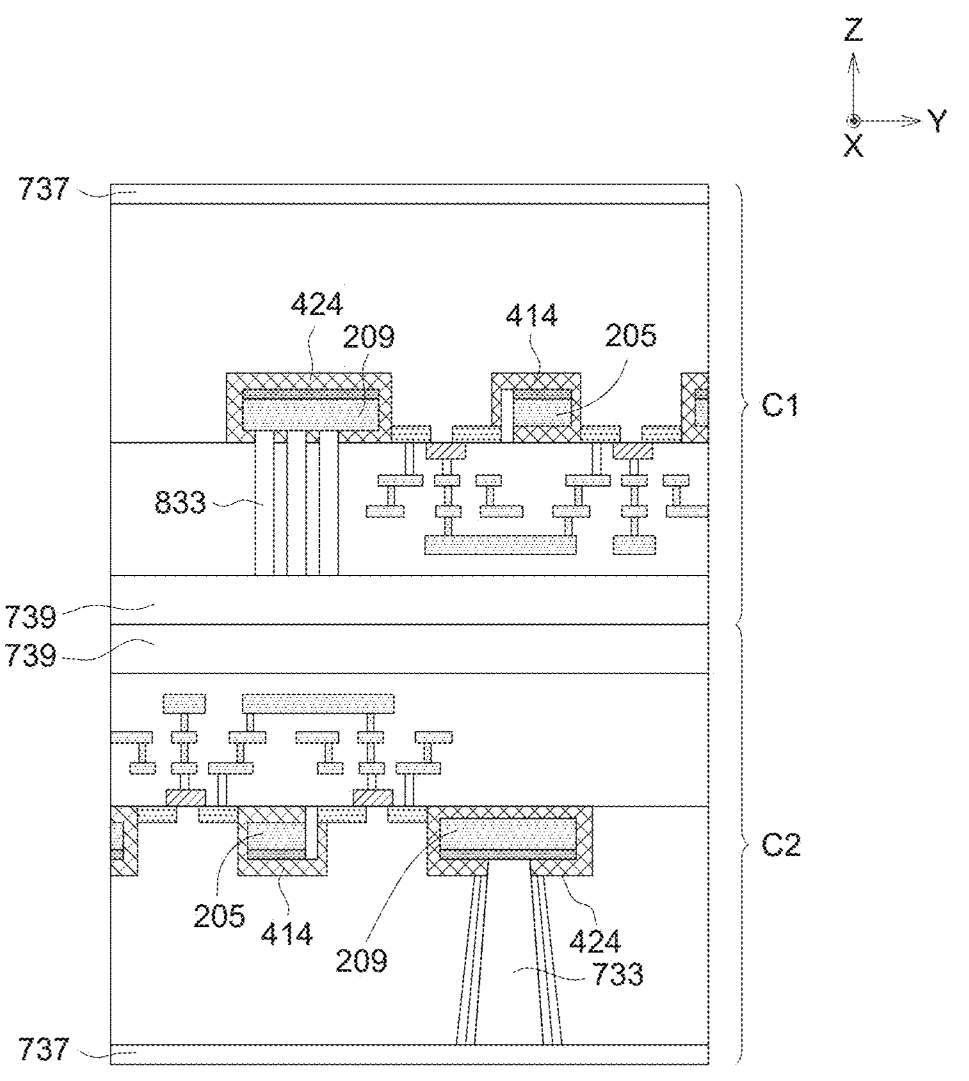

For the advanced 2.5D or 3D packaging structure or even the HBM structure, there are two or more IC/memory chips stacked together. Thus, any of the structures of FIGS. 16*a*~16*d* could be utilized in those IC chips which are then vertically stacked together. For example, as shown in FIG. 16*e*, the VHDC structures in FIG. 16*d* are utilized in both the chip C1 and chip C2 which are stacked together. In another embodiment, the chip C1 (with the VHDC structure in FIG. 16*b*) could be flipped upside down first and then stacked over the chip C2 (with the VHDC structure in FIG. 16*d*), as shown in FIG. 16*f*. Of course, there could be another interposer (such as Si interposer or other interposer) disposed between those two IC chips, and any of the structures of FIG. 16*a*, 16*b*, or 16*c* could be utilized in the interposer.

Figure 17A:
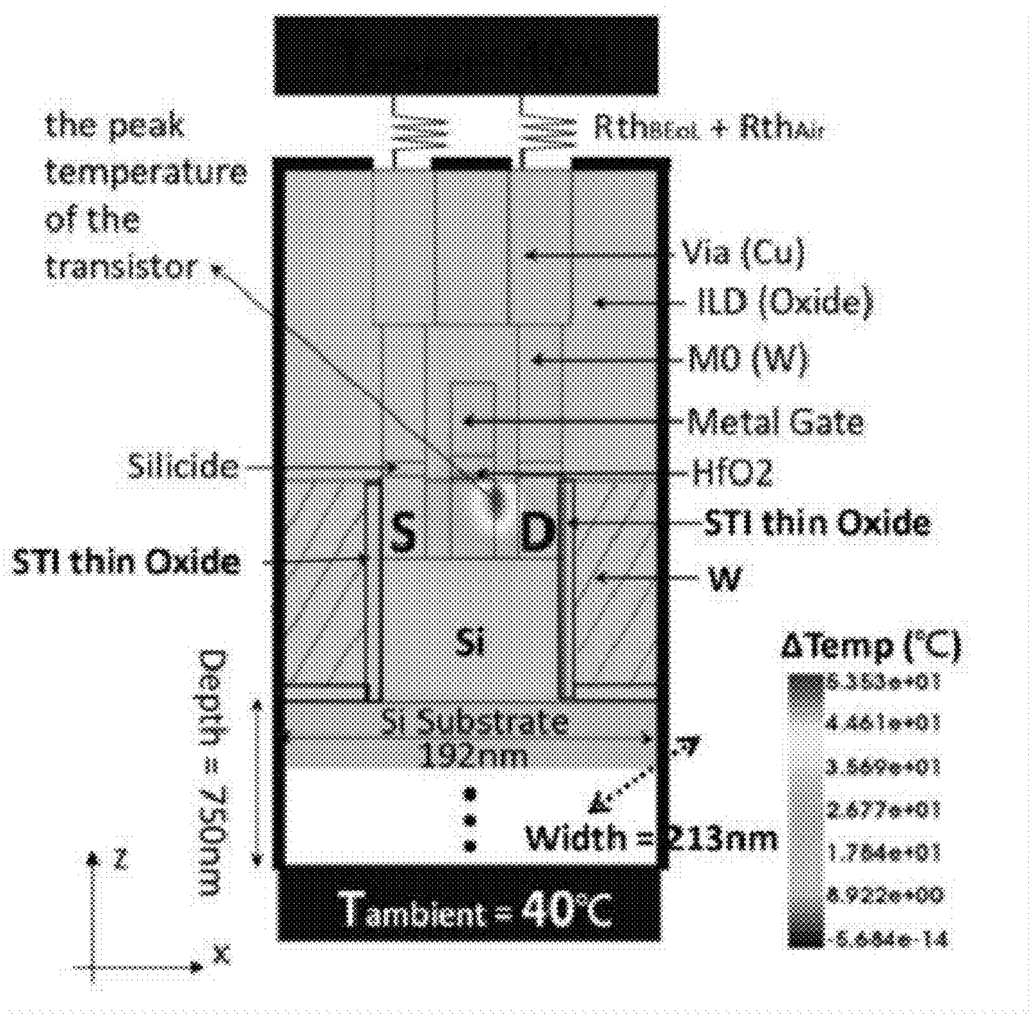
FIG. 17*a* shows the temperature distribution of a FinFET established by Sentaurus of TCAD.
Figure 17B:
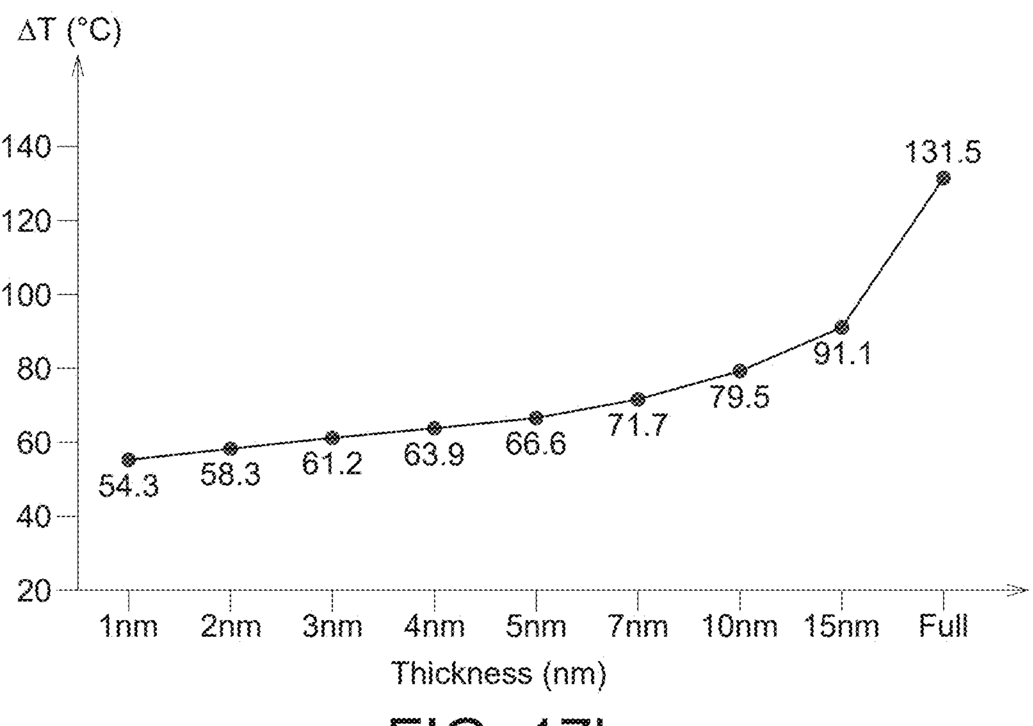
FIG. 17*b* shows a temperature difference versus thickness of STI region.

FIG. 17*a* shows the semiconductor circuit structure including a FinFET transistor and a STI region adjacent to (or surrounding) the FinFET transistor, in which portion of the STI region (marked by slash lines) is replaced by the VHDC structure made of Tungsten. FIG. 17*a* further shows the temperature distribution of FinFET established by Sentaurus of TCAD simulation software. The temperature difference (ΔT) between the peak temperature of the transistor (the hot spot region) and the ambient temperature (40° C.) is calculated when a portion of the STI region is replaced by Tungsten, as shown in FIG. 17*b*. The term "Full" in FIG. 17*b* represents that none of the STI region is not replaced by Tungsten. The terms "1 nm" to "15 nm" represent the remaining thickness of the STI region not replaced by Tungsten. It is clear that the smaller the remaining thickness of the STI region, the smaller the temperature difference between the peak temperature of the transistor and the ambient temperature (the better the heat dissipation performance). Thus, the present disclosure can effectively reduce the peak temperature of the transistor.

The present disclosure provides direct die cooling technology based on the composite-material STI regions (or heat remover structures, e.g., VHDC lines and VHDC pads under the original semiconductor surface and within the STI regions). Depending on the requirement, some VHDC structures could be connected to the transistors, and the heat remover structures can form a VHDC mesh or heat dissipation network within the chip or semiconductor substrate, which provides bigger misalignment tolerance due to the big STI regions with a lot of space for accommodating the VHDC pads, and shorten the path to connect backside TSVs to VHDC mesh to improve IR drop of the signal delivery, and enhance the heat dissipation.

It is noted that the structures and methods as described above are provided for illustration. The disclosure is not limited to the configurations and procedures disclosed above. Other embodiments with different configurations of known elements can be applicable, and the exemplified structures could be adjusted and changed based on the actual needs of the practical applications. It is, of course, noted that the configurations of figures are depicted only for demonstration, not for limitation. Thus, it is known by people skilled in the art that the related elements and layers in a semiconductor structure, the shapes or positional relationship of the elements and the procedure details could be adjusted or changed according to the actual requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor circuit structure comprising:

a semiconductor substrate with an original semiconductor surface;

a set of active regions within the semiconductor substrate;

a first shallow trench isolation (STI) region neighboring to the set of active regions; and a transistor is located within a first active region of the set of active region, wherein the transistor is a FinFET transistor or a GAA transistor;

wherein the first STI region includes a heat removing layer, and the thermal conductivity of the heat removing layer is higher than that of $SiO_2$;

wherein the transistor comprises a gate structure, a source region, and a drain region, and the heat removing layer is close to the source region or the drain region of the transistor.

2. The semiconductor circuit structure of claim 1, wherein a top surface of the heat removing layer is close to the original semiconductor surface of the semiconductor substrate.

3. The semiconductor circuit structure of claim 2, wherein the heat removing layer surrounds the transistor and is an electrical insulator during the operation of the semiconductor circuit structure.

4. The semiconductor circuit structure of claim 1, wherein the heat removing layer comprises a semiconductor material.

5. The semiconductor circuit structure of claim 4, wherein the semiconductor material comprises BN, AlN, SiC, SiGe, Si, or the combination thereof.

6. The semiconductor circuit structure of claim 4, wherein the first STI region further includes a $SiO_2$ layer under the heat removing layer.

7. The semiconductor circuit structure of claim 1, wherein the drain region of the transistor includes a lightly-doped region laterally extending from a sidewall of the semiconductor substrate and a heavily-doped region laterally extending from the sidewall of the lightly-doped region.

8. The semiconductor circuit structure of claim 7, further comprising a metal contact connected to the top of the drain region and connected to a most lateral sidewall of the drain region.

9. The semiconductor circuit structure of claim 1, wherein the first STI region surrounds the set of active regions.

10. The semiconductor circuit structure of claim 9, wherein the heat removing layer is within the first STI region and positioned under the original semiconductor surface, and the heat removing layer surrounds a peripheral border of the set of active regions.

11. The semiconductor circuit structure of claim 1, wherein the first STI region extends along a first direction to a spare STI region, the spare STI region is remote from the set of active regions and connected to the first STI region, and the heat removing layer extends along the first direction to the spare STI region.

12. The semiconductor circuit structure of claim 11, wherein the spare STI region is close to a center of the semiconductor substrate, or close to an edge portion of the semiconductor substrate.

13. The semiconductor circuit structure of claim 11, further comprising a heat removing pad within the spare STI region, wherein the heat removing layer is connected to the heat removing pad.

14. The semiconductor circuit structure of claim 13, further comprising a thermal via above the spare STI region and connected to the heat removing pad within the spare STI region.

15. The semiconductor circuit structure of claim 14, further comprising a heat dissipation plate above and connected to the thermal via.

16. The semiconductor circuit structure of claim 14, further comprises a plurality of insulators above the set of active regions, wherein the thermal via penetrates through the plurality of insulators and connects to the heat removing pad within the spare STI region.

17. The semiconductor circuit structure of claim 16, wherein the plurality of insulators and the thermal via are within a back end of line (BEOL) region of the semiconductor circuit structure.

18. The semiconductor circuit structure of claim 13, further comprising a through semiconductor via (TSV) extending from a backside surface of the semiconductor substrate to a bottom surface of the heat removing pad within the spare STI region, wherein the backside surface is opposite to the original semiconductor surface.

19. The semiconductor circuit structure of claim 18, further comprising a heat dissipation plate under the backside surface of the semiconductor substrate and connected to the through semiconductor via.

* * * * *